(12) United States Patent
Kubota

(10) Patent No.: US 10,276,422 B2
(45) Date of Patent: Apr. 30, 2019

(54) SEMICONDUCTOR DEVICE SUBSTRATE, SEMICONDUCTOR DEVICE WIRING MEMBER AND METHOD FOR MANUFACTURING THEM, AND METHOD FOR MANUFACTURING SEMICONDUCTOR DEVICE USING SEMICONDUCTOR DEVICE SUBSTRATE

(71) Applicant: Ohkuchi Materials Co., Ltd., Kagoshima (JP)

(72) Inventor: Satoshi Kubota, Kagoshima (JP)

(73) Assignee: Ohkuchi Materials Co., Ltd., Kagoshima (JP)

( * ) Notice: Subject to any disclaimer, the term of this patent is extended or adjusted under 35 U.S.C. 154(b) by 0 days.

(21) Appl. No.: 15/539,481

(22) PCT Filed: Dec. 25, 2015

(86) PCT No.: PCT/JP2015/086254
§ 371 (c)(1),
(2) Date: Jun. 23, 2017

(87) PCT Pub. No.: WO2016/104713
PCT Pub. Date: Jun. 30, 2016

(65) Prior Publication Data
US 2017/0358477 A1    Dec. 14, 2017

(30) Foreign Application Priority Data

Dec. 25, 2014   (JP) .................................. 2014-263553
Dec. 25, 2014   (JP) .................................. 2014-263554
(Continued)

(51) Int. Cl.
*H01L 21/683*   (2006.01)
*H01L 23/12*    (2006.01)
(Continued)

(52) U.S. Cl.
CPC ........ *H01L 21/6835* (2013.01); *H01L 21/563* (2013.01); *H01L 21/568* (2013.01);
(Continued)

(58) Field of Classification Search
CPC . H01L 21/6835; H01L 21/563; H01L 21/568; H01L 23/49558; H01L 23/49575;
(Continued)

(56) References Cited

U.S. PATENT DOCUMENTS

2003/0111734 A1*  6/2003  Kobayashi .............. H01L 23/24
                                                          257/774
2005/0000729 A1   1/2005  Iijima et al.
(Continued)

FOREIGN PATENT DOCUMENTS

JP   2001-168130   6/2001
JP   2002-261190   9/2002
(Continued)

OTHER PUBLICATIONS

International Search Report dated Mar. 22, 2016 in International (PCT) Application No. PCT/JP2015/086254.

*Primary Examiner* — Sitaramarao S Yechuri
(74) *Attorney, Agent, or Firm* — Wenderoth, Lind & Ponack, L.L.P.

(57) ABSTRACT

A semiconductor device substrate and wiring member including a first noble metal plating layer to become internal terminals is formed at predetermined sites on a metal plate, a metal plating layer is formed on the first noble metal plating layer as having a same shape as the first noble metal plating layer, a second noble metal plating layer to become external terminals is formed on a part of the metal plating layer, and a height of a surface of the second noble metal plating layer from a surface of the metal plate is larger than
(Continued)

a height of a surface of the first noble metal plating layer from the surface of the metal plate.

19 Claims, 19 Drawing Sheets

(30) Foreign Application Priority Data

| Dec. 25, 2014 | (JP) | 2014-263555 |
| Dec. 25, 2014 | (JP) | 2014-263556 |
| Dec. 26, 2014 | (JP) | 2014-265373 |
| Dec. 26, 2014 | (JP) | 2014-265374 |

(51) Int. Cl.

| *H01L 23/14* | (2006.01) |
| *H01L 23/29* | (2006.01) |
| *H01L 23/31* | (2006.01) |
| *H01L 23/50* | (2006.01) |
| *H01L 21/56* | (2006.01) |
| *H01L 23/495* | (2006.01) |
| *H01L 23/498* | (2006.01) |
| *H01L 23/00* | (2006.01) |

(52) U.S. Cl.
CPC .............. *H01L 23/12* (2013.01); *H01L 23/14* (2013.01); *H01L 23/29* (2013.01); *H01L 23/31* (2013.01); *H01L 23/49558* (2013.01); *H01L 23/49575* (2013.01); *H01L 23/49816* (2013.01); *H01L 23/50* (2013.01); *H01L 24/32* (2013.01); *H01L 24/48* (2013.01); *H01L 24/83* (2013.01); *H01L 2221/68345* (2013.01); *H01L 2224/05573* (2013.01); *H01L 2224/131* (2013.01); *H01L 2224/16057* (2013.01); *H01L 2224/16225* (2013.01); *H01L 2224/16245* (2013.01); *H01L 2224/32225* (2013.01); *H01L 2224/48091* (2013.01); *H01L 2224/48227* (2013.01); *H01L 2224/73265* (2013.01); *H01L 2924/0002* (2013.01); *H01L 2924/181* (2013.01)

(58) Field of Classification Search
CPC ... H01L 23/49816; H01L 24/32; H01L 24/48; H01L 24/83; H01L 2221/68345; H01L 2224/05573; H01L 2224/131; H01L 2224/16057; H01L 2224/16245
See application file for complete search history.

(56) References Cited

U.S. PATENT DOCUMENTS

| 2007/0121305 | A1 | 5/2007 | Iijima et al. |
| 2007/0268675 | A1* | 11/2007 | Chinda .............. H01L 21/4853 361/748 |
| 2008/0145967 | A1 | 6/2008 | Chew et al. |
| 2008/0251944 | A1 | 10/2008 | Oi |
| 2008/0296254 | A1 | 12/2008 | Iijima et al. |
| 2009/0102043 | A1 | 4/2009 | Jimmy et al. |
| 2009/0174053 | A1 | 7/2009 | Ikenaga et al. |
| 2009/0291530 | A1 | 11/2009 | Jimmy et al. |
| 2010/0264526 | A1* | 10/2010 | Jimmy ................ H01L 21/6835 257/668 |
| 2011/0014752 | A1 | 1/2011 | Ikenaga et al. |
| 2013/0247372 | A1 | 9/2013 | Iijima et al. |
| 2014/0240934 | A1 | 8/2014 | Iijima et al. |

FOREIGN PATENT DOCUMENTS

| JP | 2005-26452 | 1/2005 |
| JP | 2005-244033 | 9/2005 |
| JP | 2008-91719 | 4/2008 |
| JP | 2009-164594 | 7/2009 |
| JP | 2011-238964 | 11/2011 |

* cited by examiner

LAMINATING

METAL PLATE

EXPOSURE

DEVELOPMENT

PLATING

INTERNAL TERMINAL — WIRING PART — EXTERNAL TERMINAL

LAMINATING

EXPOSURE

DEVELOPMENT

PLATING

DFR PEELING

RESIN CHARGING (SINGLE SIDE)

BACK ETCHING OR THE LIKE

<FLIP CHIP METHOD>   <WIRE METHOD>

MOUNTING

RESIN CHARGING

FINISH

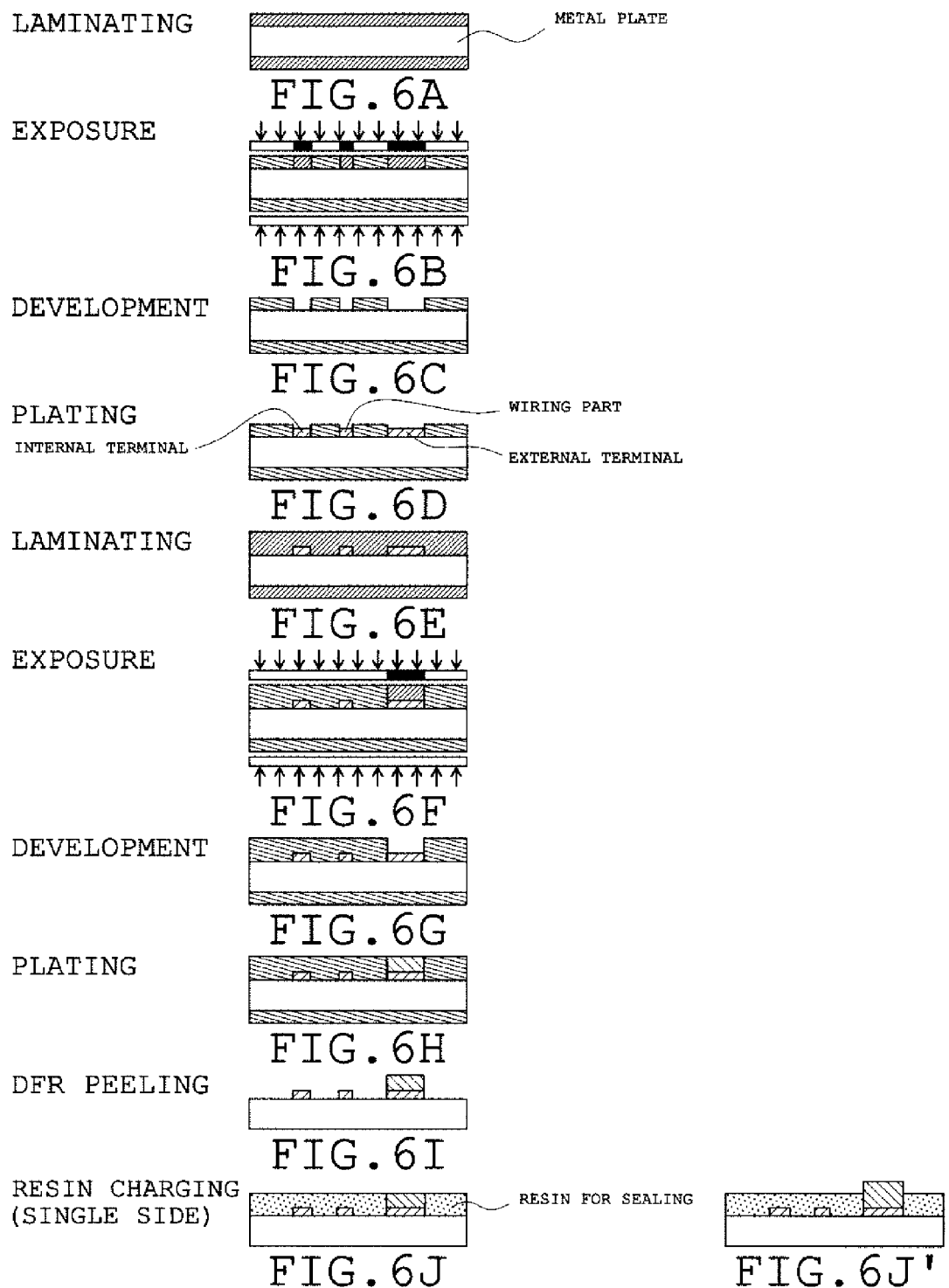

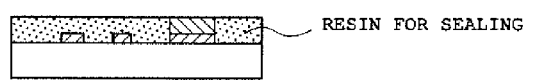 RESIN FOR SEALING 
FIG. 7A          FIG. 7A'
BACK ETCHING OR THE LIKE
FIG. 7B
<FLIP CHIP METHOD>     <WIRE METHOD>
MOUNTING
SEMICONDUCTOR ELEMENT
       
FIG. 7C          FIG. 7D
RESIN CHARGING
FIG. 7E
FINISH
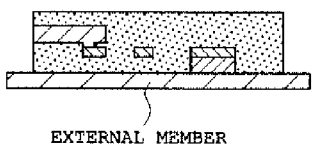
EXTERNAL MEMBER
FIG. 7F

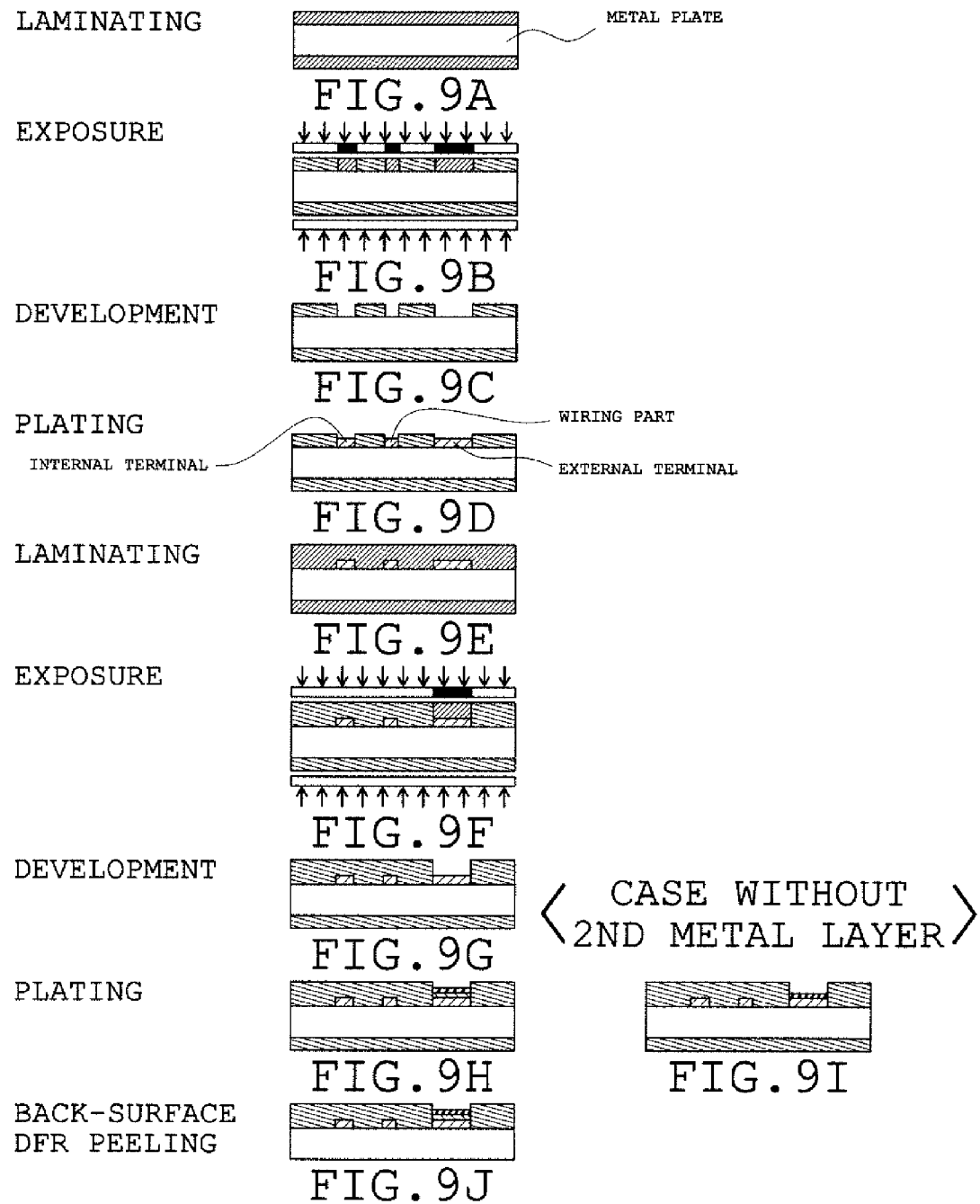

BACK ETCHING OR THE LIKE

<FLIP CHIP METHOD>    <WIRE METHOD>
MOUNTING

SEMICONDUCTOR ELEMENT

RESIN CHARGING

⟨CASE WHERE SEMICONDUCTOR DEVICE SUBSTRATE WITHOUT 2ND METAL LAYER IS USED⟩

FINISH

EXTERNAL MEMBER    SOLDER BALL

EXTERNAL MEMBER    SOLDER BALL

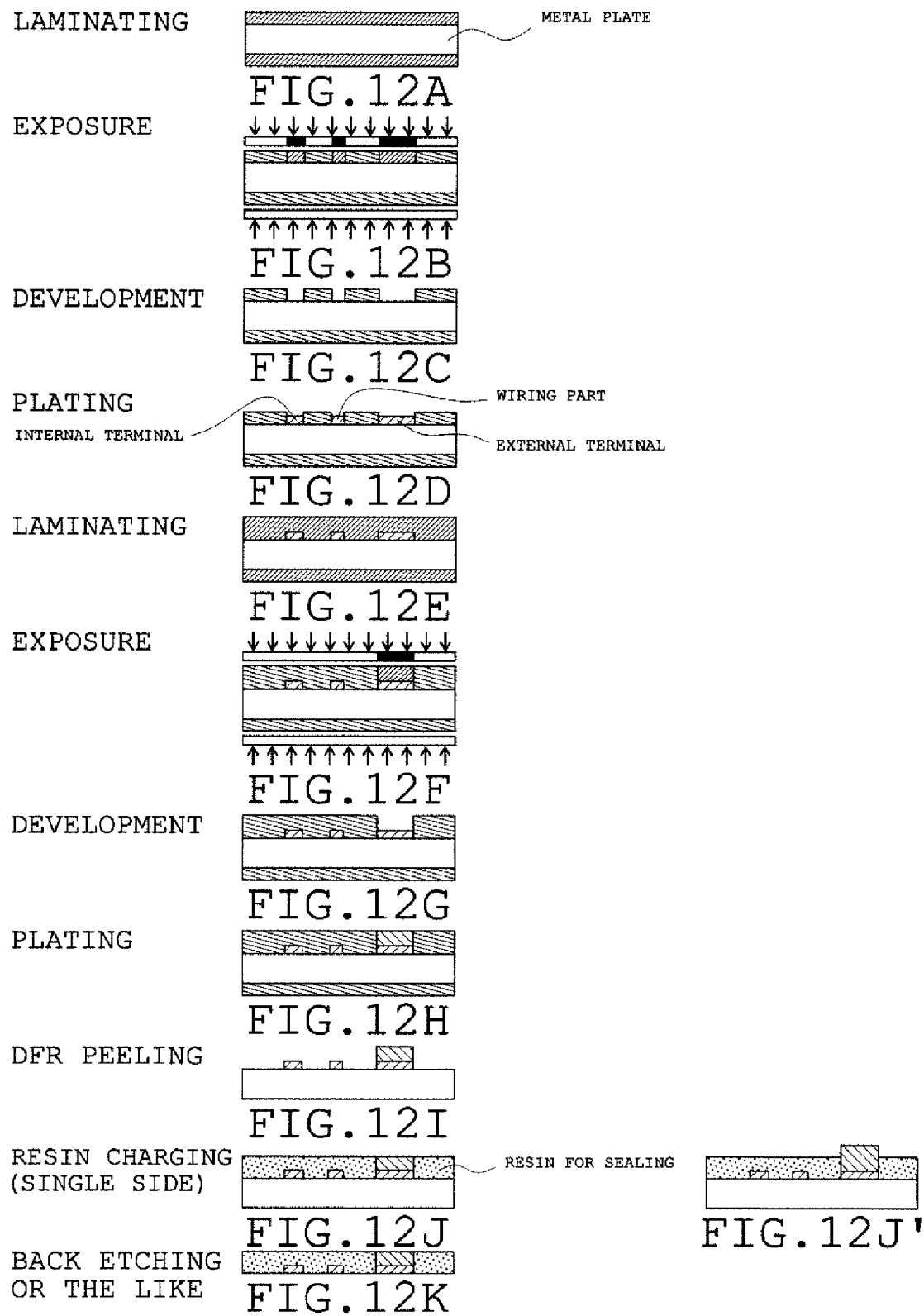

 RESIN FOR SEALING 
FIG.13A          FIG.13A'
<FLIP CHIP METHOD>     <WIRE METHOD>
MOUNTING
SEMICONDUCTOR ELEMENT      
FIG.13B          FIG.13C
RESIN CHARGING
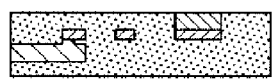
FIG.13D
FINISH
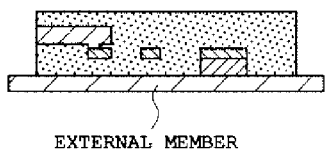
EXTERNAL MEMBER
FIG.13E

LAMINATING

EXPOSURE

DEVELOPMENT

PLATING

DFR PEELING

<FLIP CHIP METHOD>   <WIRE METHOD>
MOUNTING
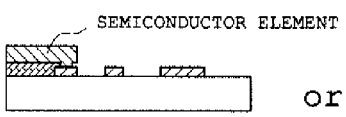 or 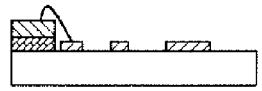
FIG.16A            FIG.16B
RESIN CHARGING
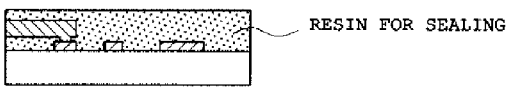 ← RESIN FOR SEALING
FIG.16C
BACK ETCHING OR THE LIKE
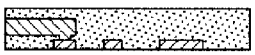
FIG.16D
⟨PROCESS WHERE SOLDER RESIST IS USED⟩
FORMATION OF EXTERNAL INSULATING LAYER
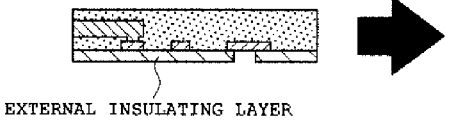
EXTERNAL INSULATING LAYER
FIG.16E
RAW MATERIAL
FIG.16F
APPLICATION
FIG.16G
PRECURING
FIG.16H
EXPOSURE
FIG.16I
DEVELOPMENT
FIG.16J
POSTCURING
FIG.16K
FINISH
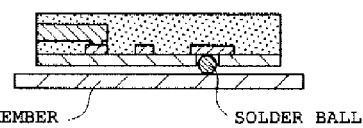
EXTERNAL MEMBER — — SOLDER BALL
FIG.16L

SEMICONDUCTOR DEVICE SUBSTRATE, SEMICONDUCTOR DEVICE WIRING MEMBER AND METHOD FOR MANUFACTURING THEM, AND METHOD FOR MANUFACTURING SEMICONDUCTOR DEVICE USING SEMICONDUCTOR DEVICE SUBSTRATE

TECHNICAL FIELD

The present invention relates to a semiconductor device substrate, a semiconductor device wiring member and a method for manufacturing them, and a method for manufacturing a semiconductor device using a semiconductor device substrate.

BACKGROUND ART

Conventionally, of semiconductor device substrates, there are those of a type having internal terminals, external terminals and wiring parts formed by metal plating on a metal plate as a base substrate, to be used in manufacturing, for example, a surface-mount type, resin-sealed semiconductor device with ELP (Etched Leadless Package) structure wiring.

Conventionally, a semiconductor device substrate of this type and a semiconductor device using such a semiconductor device substrate are described, for example, in Japanese Patent KOKAI No. 2009-164594 (JP 2009-164594).

In the substrate for a semiconductor device described in JP 2009-164594, on a metal plate, there is formed by plating, from the metal-plate side, an external terminal surface having external terminal parts, on which formed by plating into the same shape is an intermediate layer, on which further formed by plating into the same shape is an internal terminal surface having internal terminal parts. This semiconductor device substrate is configured so that the internal terminal surface having the internal terminal parts, which are to be electrically connected with a semiconductor element, is arranged on the uppermost surface and the height from the metal plate to the uppermost surface is substantially even over the entirety.

In manufacturing of a semiconductor device, the semiconductor device substrate described in JP 2009-164594 is used in a state in which the external terminal surface is in contact with the surface on the metal plate side and, regarding the internal terminal surface, the surface opposite to the metal plate is left uncovered. To be specific, a semiconductor element is mounted on the internal terminal surface side of the semiconductor device substrate, and the semiconductor element mount portion is sealed with a resin after electrodes of the semiconductor element and the internal terminal parts are connected. After sealing with the resin, the metal plate is removed by dissolution by etching or the like, to uncover, on the back surface of the resin for sealing, the external connection surface of the portions formed by plating, which have the internal terminal parts, the wiring parts and the external terminal parts. Thereafter, a resin covering the entirely bare external connection surface is formed, and openings that make only the external terminal parts uncovered is formed.

In practical production, however, if the external terminal surface is formed from the metal plate side and the internal terminal surface is formed by plating on the uppermost layer, the plating thickness varies; when the plating thickness is about 30 μm, for example, the variety in height about 5 to 8 μm is generated. Therefore, when a semiconductor element is mounted and electrically connected with the internal terminal parts, the semiconductor element may be mounted on a tilt or cause a conduction failure in the electrical connection. Further, the processes of forming a resin covering the entire external connection surface and forming openings to uncover only the external terminal parts are required, to lower the productivity for semiconductor devices accordingly.

As described above, according to the semiconductor device substrate in JP 2009-164594, at the uppermost layer, a non-uniform height owing to unevenness during production is generated among the internal terminal surface on which a semiconductor element is to be mounted and the internal terminal parts to be electrically connected with the semiconductor element, to be eventually brought into conduction failure caused by a tilt of the semiconductor element as mounted or a poor connection in bonding. Therefore, an object of the present invention is to provide a semiconductor device substrate and a manufacturing method therefor that can achieve a uniform height over an internal terminal surface on which a semiconductor element is to be mounted and internal terminal parts to be electrically connected with the semiconductor element and that can dispense with a process of forming opening parts for uncovering only external terminal parts, thereby to make it feasible to manufacture a resin-sealed type semiconductor device with high reliability with a decreased number of processes in manufacturing the semiconductor device.

Also, an object of the present invention is to provide a semiconductor device substrate wiring member and a manufacturing method therefor that can achieve a uniform height over an internal terminal surface on which a semiconductor element is to be mounted and internal terminal parts to be electrically connected with the semiconductor element and that can dispense, in a procedure for manufacturing a semiconductor device, with processes of removing a metal plate by etching and of forming opening parts for uncovering only external terminal parts, thereby to make it feasible to manufacture a resin-sealed type semiconductor device with high reliability with a decreased number of processes in manufacturing the semiconductor device.

Also, an object of the present invention is to provide a method for manufacturing a semiconductor device that can eliminate a variety of height owing to unevenness among internal terminal parts to be electrically connected with a semiconductor element, thereby to prevent the semiconductor element as mounted from tilting and to preclude conduction failure resulting from a poor connection in bonding, and to provide a method for manufacturing a semiconductor device that can dispense with a process of forming opening parts that uncover only the external terminal parts.

SUMMARY OF THE INVENTION

In order to attain the above-mentioned objects, a semiconductor device substrate according to the present invention is configured so that a plating layer that is to become internal terminals is formed at predetermined sites on a predetermined surface and a plating layer that is to become external terminals is formed on a part of the plating layer that is to become the internal terminals, wherein a height of a surface of the plating layer that is to become the external terminals from the predetermined surface is larger than a height of a surface of other plating layer from the predetermined surface.

In the semiconductor device substrate according to the present invention, it is preferable that the plating layer that is to become the internal terminals is configured of a first noble metal plating layer formed at predetermined sites on a metal plate, a metal plating layer is formed on the first noble metal plating layer as having a same shape as the first noble metal plating layer, the plating layer that is to become the external terminals is configured of a second noble metal plating layer formed on a part of the metal plating layer, and that a height of a surface of the second noble metal plating layer from a surface of the metal plate is larger than a height of a surface of the metal plating layer from the surface of the metal plate.

In the semiconductor device substrate according to the present invention, it is preferable that the plating layer that is to become the internal terminals is configured of a first noble metal plating layer formed at predetermined sites on a metal plate, a metal plating layer is formed on the first noble metal plating layer as having a same shape as the first noble metal plating layer, the plating layer that is to become the external terminals is configured of a second noble metal plating layer formed on a part of the metal plating layer, and that a resin layer is further formed at sites that are free from the second noble metal plating layer on the metal plate and the metal plating layer, as leaving an upper surface of the second noble metal plating layer uncovered.

In the semiconductor device substrate according to the present invention, it is preferable that the plating layer that is to become the internal terminals is configured of a first noble metal plating layer formed at predetermined sites on a metal plate, a metal plating layer is formed on the first noble metal plating layer as having a same shape as the first noble metal plating layer, a permanent resist is formed on the metal plate and the metal plating layer as having openings at predetermined sites of the metal plating layer, and that the plating layer that is to become the external terminals is configured of a second noble metal plating layer formed on the metal plating layer at positions of the openings in the permanent resist.

In the semiconductor device substrate according to the present invention, it is preferable that a second metal plating layer is formed between the metal plating layer and the second noble metal plating layer, as having a same shape as the second noble metal plating layer.

In the semiconductor device substrate according to the present invention, it is preferable that, in order from a metal-plate side, an Au plating layer and a Pd plating layer serving as the first noble metal plating layer, Ni plating layers serving as the metal plating layer and the second metal plating layer, and a Pd plating layer and an Au plating layer serving as the second noble metal plating layer are formed.

In the semiconductor device substrate according to the present invention, it is preferable that the permanent resist is formed to have the openings for leaving an upper surface of the second noble metal plating layer uncovered, and that the upper surface of the second noble metal plating layer is positioned at a level below an upper surface of the permanent resist.

Also, a semiconductor device wiring member according to the present invention is manufactured by use of the above-mentioned semiconductor device substrate according to the present invention, wherein the plating layer that is to become the internal terminals is configured of a first noble metal plating layer that is formed, at predetermined sites of one surface of a resin layer, with a lower surface thereof being uncovered at a same level as the one surface of the resin layer, a metal plating layer is formed on the first noble metal plating layer as having a same shape as the first noble metal plating layer, and the plating layer that is to become the external terminals is configured of a second noble metal plating layer that is formed, on a part of the metal plating layer, with an upper surface thereof being free from covering by other surface of the resin layer.

In the semiconductor device wiring member according to the present invention, it is preferable that a second metal plating layer is formed between the metal plating layer and the second noble metal plating layer, as having a same shape as the second noble metal plating layer.

In the semiconductor device wiring member according to the present invention, it is preferable that, in order from a side of the one surface of the resin layer, an Au plating layer and a Pd plating layer serving as the first noble metal plating layer, Ni plating layers serving as the metal plating layer and the second metal plating layer, and a Pd plating layer and an Au plating layer serving as the second noble metal plating layer are formed.

Also, a method according to the present invention for manufacturing a semiconductor device substrate includes: a step of forming, on a metal plate, a resist mask having pattern-A openings; a step of forming a first noble metal plating layer in the pattern-A openings; a step of forming, on the first noble metal plating layer, a metal plating layer having a same shape as the first noble metal plating layer; a step of peeling off the resist mask; a step of forming, after peeling off of the resist mask, a second resist mask having pattern-B openings that leave a part of the metal plating layer uncovered; and a step of forming a second noble metal plating layer or a second metal plating layer and a second noble metal plating layer in the pattern-B openings.

The method according to the present invention for manufacturing a semiconductor device substrate preferably includes a step of peeling off the second resist mask after formation of the second noble metal plating layer or the second metal plating layer and the second noble metal plating layer in the pattern-B openings.

The method according to the present invention for manufacturing a semiconductor device substrate preferably includes: a step of peeling off the second resist mask after formation of the second noble metal plating layer or the second metal plating layer and the second noble metal plating layer in the pattern-B openings; and a step of forming, after peeling off of the second resist mask, a resin layer at sites that are free from the second noble metal plating layer on the metal plate and the metal plating layer, as leaving an upper surface of the second noble metal plating layer uncovered.

In the method according to the present invention for manufacturing a semiconductor device substrate, it is preferable that the second resist mask is made of a permanent resist.

In the method according to the present invention for manufacturing a semiconductor device substrate, it is preferable that an upper surface of the second noble metal plating layer is positioned at a level below an upper surface of the second resist mask.

Also, a method according to the present invention for manufacturing a semiconductor device wiring member uses the above-mentioned method according to the present invention for manufacturing a semiconductor device substrate, and includes: a step of peeling off the second resist mask after formation of the second noble metal plating layer or the second metal plating layer and the second noble metal plating layer in the pattern-B openings; a step of forming, after peeling off of the second resist mask, a resin layer at sites that are free from the second noble metal plating layer on the metal plate and the metal plating layer, as leaving an upper surface of the second noble metal plating layer uncovered; and a step of removing the metal plate after formation of the resin layer.

Also, a method according to the present invention for manufacturing a semiconductor device uses the above-mentioned semiconductor device substrate according to the present invention, and includes: a step of forming a resin layer as leaving the surface of the plating layer that is to become the external terminals uncovered, upon using the semiconductor device substrate in which the plating layer that is to become the internal terminals is formed on a metal plate, the plating layer that is to become the external terminals is formed on a part of the plating layer that is to become the internal terminals, and in which a height of the surface of the plating layer that is to become the external terminals from a surface of the metal plate is larger than a height of a surface of other plating layer from the surface of the metal plate; a step of fabricating a wiring member in which the plating layers as formed are held by the resin layer, by removing the metal plate after formation of the resin layer with the surface of the plating layer that is to become the external terminals being left uncovered; and a step of mounting a semiconductor element on the wiring member.

Also, a method according to the present invention for manufacturing a semiconductor device uses the above-mentioned semiconductor device substrate according to the present invention, and includes: a step of forming a resin layer as leaving the surface of the plating layer that is to become the external terminals uncovered, upon using the semiconductor device substrate in which the plating layer that is to become the internal terminals is formed on a metal plate, the plating layer that is to become the external terminals is formed on a part of the plating layer that is to become the internal terminals, and in which a height of the surface of the plating layer that is to become the external terminals from a surface of the metal plate is larger than a height of a surface of other plating layer from the surface of the metal plate; a step of fabricating a wiring member in which the plating layers as formed are held by the resin layer, by removing the metal plate after formation of the resin layer with the surface of the plating layer that is to become the external terminals being left uncovered; and a step of mounting a semiconductor element on a former metal-plate-side surface of the plating layer that is to become the internal terminals of the wiring member as fabricated.

Also, a method according to the present invention for manufacturing a semiconductor device uses the above-mentioned semiconductor device substrate according to the present invention, and includes: a step of forming a resin layer as leaving the surface of the plating layer that is to become the external terminals uncovered, on the semiconductor device substrate in which the plating layer that is to become the internal terminals is formed on a metal plate, the plating layer that is to become the external terminals is formed on a part of the plating layer that is to become the internal terminals, and in which a height of the surface of the plating layer that is to become the external terminals from a surface of the metal plate is larger than a height of a surface of other plating layer from the surface of the metal plate; a step of fabricating a wiring member in which the plating layers as formed are held by the resin layer, by removing the metal plate after formation of the resin layer with the surface of the plating layer that is to become the external terminals being left uncovered; a step of mounting a semiconductor element on a former metal-plate-side surface of the plating layer that is to become the internal terminals of the wiring member as fabricated, to establish conduction between electrodes of the semiconductor element and the internal terminals; and a step of resin-sealing a portion on which the semiconductor element is mounted.

Also, a method according to the present invention for manufacturing a semiconductor device uses the above-mentioned semiconductor device substrate according to the present invention, and includes: a step of removing a metal plate, from the semiconductor device substrate in which a permanent resist layer of a predetermined thickness is formed on the metal plate, the plating layer that is to become the internal terminals is formed in the permanent resist layer as fronting the metal plate, the plating layer that is to become the external terminals is formed on a part of the plating layer that is to become the internal terminals, and in which only an upper surface of the plating layer that is to become the external terminals is left uncovered at openings in an upper surface of the permanent resist layer, thereby to fabricate a wiring member in which the plating layers are fixed by the permanent resist layer; and a step of mounting a semiconductor element on a metal-plate removal side of the wiring member as fabricated.

Also, a method according to the present invention for manufacturing a semiconductor device uses the above-mentioned semiconductor device substrate according to the present invention, and includes: a step of removing a metal plate from the semiconductor device substrate in which a permanent resist layer of a predetermined thickness is formed on the metal plate, the plating layer that is to become the internal terminals is formed in a predetermined pattern in the permanent resist layer on a metal-plate side, the plating layer that is to become the external terminals is formed on a part of the plating layer that is to become the internal terminals, and in which only an upper surface of the plating layer that is to become the external terminals is left uncovered at openings in an upper surface of the permanent resist layer, thereby to prepare a wiring member in which the plating layers are fixed by the permanent resist layer; a step of mounting a semiconductor element on a metal-plate removal side of the wiring member as prepared, to establish conduction at portions, as being uncovered on the wiring member, of the plating layer that is to become the internal terminals with electrodes of the semiconductor element; and a step of resin-sealing a semiconductor-element mount side.

In the method according to the present invention for manufacturing a semiconductor device, it is preferable that the semiconductor device substrate is configured so that there is formed on the metal plate a first noble metal plating layer, which is to become the internal terminals and on which there is formed a metal plating layer having a same shape as the first noble metal plating layer, so that there is formed on a part of the metal plating layer a second noble metal plating layer, which is to become the external terminals, or there are formed, into an identical shape, on a part of the metal plating layer, a second metal plating layer and a second noble metal plating layer, which is to become the external terminals, and so that the permanent resist layer is formed on the metal plate to be thicker than the plating layers with a surface of the second noble metal plating layer being left uncovered at the openings in the permanent resist layer.

In the method for manufacturing a semiconductor device according to the present invention, it is preferable that a plating layer made of other metal is formed between the plating layer that is to become the internal terminals and the plating layer that is to become the external terminals.

Effects of the Invention

According to the present invention, it is possible to obtain a semiconductor device substrate and a manufacturing method therefor that can achieve a uniform height over an internal terminal surface on which a semiconductor element is to be mounted and internal terminal parts to be electrically connected with the semiconductor element and that make it feasible to manufacture a resin-sealed type semiconductor device with high reliability with a decreased number of processes in manufacturing the semiconductor device.

Also, according to the present invention, it is possible to obtain a semiconductor device substrate wiring member and a manufacturing method therefor that can achieve a uniform height over an internal terminal surface on which a semiconductor element is to be mounted and internal terminal parts to be electrically connected with the semiconductor element and that can dispense, in a procedure for manufacturing a semiconductor device, with processes of removing a metal plate by etching and of forming opening parts for uncovering only external terminal parts, thereby to make it feasible to manufacture a resin-sealed type semiconductor device with high reliability with a decreased number of processes in manufacturing the semiconductor device.

Also, according to the present invention, it is possible to obtain a method for manufacturing a semiconductor device that can eliminate a variety of height owing to unevenness among internal terminal parts to be electrically connected with a semiconductor element, thereby to prevent the semiconductor element as mounted from tilting and to preclude conduction failure resulting from a poor connection in bonding, and to obtain a method for manufacturing a semiconductor device that can dispense with a process of forming opening parts that uncover only the external terminal parts.

BRIEF DESCRIPTION OF THE DRAWINGS

FIG. 1A is a plan view as viewed from an external-terminal side, and FIG. 1B is a cross-sectional view taken along a line A-A in FIG. 1A.

FIG. 5A is a plan view as viewed from an external-terminal side, and FIG. 5B is a cross-sectional view taken along a line A-A in FIG. 5A.

FIGS. 6A-6J' are explanatory diagrams that show a manufacturing procedure for the semiconductor device substrate shown in FIG. 5A and FIG. 5B.

FIGS. 7A-7F are explanatory diagrams that show one example of manufacturing procedure for a resin-sealed type semiconductor device using the semiconductor device substrate according to the second embodiment mode manufactured via the manufacturing procedure shown in FIGS. 6A-6J'.

FIG. 8A is a plan view as viewed from an external-terminal side, and FIG. 8B is a cross-sectional view taken along a line A-A in FIG. 8A.

FIGS. 9A-9J are explanatory diagrams that show a manufacturing procedure for the semiconductor device substrate shown in FIG. 8A and FIG. 8B.

FIG. 11A is a plan view as viewed from an external-terminal side, and FIG. 11B is a cross-sectional view taken along a line A-A in FIG. 11A.

FIGS. 12A-12K are explanatory diagrams that show a manufacturing procedure for the semiconductor device substrate shown in FIG. 11A and FIG. 11B.

FIGS. 13A-13E are explanatory diagrams that show one example of manufacturing procedure for a resin-sealed type semiconductor device using the semiconductor device wiring member according to the fourth embodiment mode manufactured via the manufacturing procedure shown in FIGS. 12A-12K.

FIGS. 16A-16L are explanatory diagrams that show one example of manufacturing procedure for a resin-sealed type semiconductor device using the semiconductor device substrate according to Reference Example 1 manufactured via the manufacturing procedure shown in FIGS. 14A-14E.

FIG. 17A and FIG. 17A' are explanatory diagrams that respectively show configurations of semiconductor device substrates to be used for the manufacturing according to the embodied example for a semiconductor device, FIG. 17B and FIG. 17B' are explanatory diagrams that respectively show states in which the semiconductor device substrates shown in FIGS. 17A and 17A' are resin-sealed with surfaces of external terminal parts being left uncovered, FIG. 17C is an explanatory diagram that shows a state in which the semiconductor device substrate shown in FIG. 17B is cleared of a metal substrate, to turn into a wiring member, and FIG. 17D is an explanatory diagram that shows a state in which a semiconductor element is mounted on a plating-layer side, which is to become internal terminals, of the wiring member shown in FIG. 17C, electrodes of the semiconductor element and the internal terminal part of the wiring member are connected together, and in which the semiconductor-element-mount side is resin-sealed.

DETAILED DESCRIPTION OF THE INVENTION

Figure 1A:
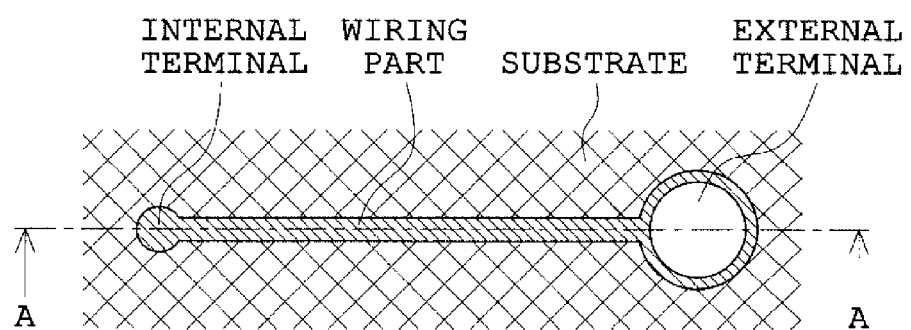
FIG. 1A and FIG. 1B are diagrams that show a configuration of a semiconductor device substrate according to a first embodiment mode of the present invention.

Preceding an explanation of embodiment modes, the function and effect of the present invention will be described.

A semiconductor device substrate according to the present invention is configured so that a plating layer that is to become internal terminals is formed at predetermined sites on a predetermined surface and a plating layer that is to become external terminals is formed on a part of the plating layer that is to become the internal terminals, wherein a height of a surface of the plating layer that is to become the external terminals from the predetermined surface is larger than a height of a surface of other plating layer from the predetermined surface.

For example, a semiconductor device substrate according to a first embodiment mode of the present invention is a semiconductor device substrate on which a semiconductor element is to be mounted after removal of a metal plate, and is configured so that there are formed, from the metal-plate side, a first noble metal plating layer, which is to become internal terminals, at predetermined sites on the metal plate, a metal plating layer having a same shape as the first noble metal plating layer on the first noble metal plating layer, and further a second noble metal plating layer, which is to become external terminals, on a part of the metal plating layer, and so that a height of a surface of the second noble metal plating layer from a surface of the metal plate is larger than a height of a surface of the metal plating layer from the surface of the metal plate.

If, as in the semiconductor device substrate according to the first embodiment mode of the present invention, external terminals having a thickness different from internal terminals or wiring parts are preliminarily provided at sites corresponding to openings in a resin layer, which are to be provided, in a case of a conventional semiconductor device substrate, in a manufacturing procedure of a semiconductor device, it is easy, in a manufacturing procedure of a semiconductor device, to resin-seal the internal terminals and the wiring parts while leaving only the external terminals uncovered. Therefore, unlike the conventional semiconductor device substrate, providing an insulating layer having openings in a connection surface for an external member is dispensable in the manufacturing procedure of a semiconductor device, and thus productivity is improved with a decreased number of processes in manufacturing a semiconductor device.

Also, for example, a semiconductor device substrate according to a second embodiment mode of the present invention is a semiconductor device substrate on which a semiconductor element is to be mounted after removal of a metal plate, and is configured so that there are formed, from the metal-plate side, a first noble metal plating layer, which is to become internal terminals, at predetermined sites on the metal plate, a metal plating layer having a same shape as the first noble metal plating layer on the first noble metal plating layer, and further a second noble metal plating layer, which is to become external terminals, on a part of the metal plating layer, and so that a resin layer is further formed at sites that are free from the second noble metal plating layer on the metal plate and the metal plating layer, as leaving an upper surface of the second noble metal plating layer uncovered.

If, as in the semiconductor device substrate according to the second embodiment mode of the present invention, external terminals having a thickness different from internal terminals or wiring parts are preliminarily provided at sites corresponding to openings in a resin layer, which are to be provided in a manufacturing procedure of a semiconductor device in a case of a conventional semiconductor device substrate, and the internal terminals and the wiring parts are resin-sealed with only the external terminals being left uncovered, unlike the conventional semiconductor device substrate, providing an insulating layer having openings in a connection surface for an external member is dispensable in the manufacturing procedure of a semiconductor device, and thus productivity is improved with a decreased number of processes in manufacturing a semiconductor device.

Also, for example, a semiconductor device substrate according to a third embodiment mode of the present invention is a semiconductor device substrate on which a semiconductor element is to be mounted after removal of a metal plate, and is configured so that there are formed, from the metal-plate side, a first noble metal plating layer, which is to become internal terminals, at predetermined sites on the metal plate, a metal plating layer having a same shape as the first noble metal plating layer on the first noble metal plating layer, a permanent resist on the metal plate and the metal plating layer as having openings at predetermined sites of the metal plating layer, and further a second noble metal plating layer, which is to become external terminals, on the metal plating layer at positions of the openings in the permanent resist.

If, as in the semiconductor device substrate according to the third embodiment mode of the present invention, there is preliminarily provided, as a permanent resist, a resin that would be provided in a manufacturing procedure of a semiconductor device in a case of a conventional semiconductor device substrate, and external terminals having a thickness different from internal terminals or wiring parts are preliminarily provided in openings in the permanent resist so that the internal terminals and the wiring parts are sealed with the permanent resist while only the external terminals are left uncovered, unlike the conventional semiconductor device substrate, providing an insulating layer having openings in a connection surface for an external member is dispensable in the manufacturing procedure of a semiconductor device, and thus productivity is improved with a decreased number of processes in manufacturing a semiconductor device.

Also, a semiconductor device wiring member according to the present invention is a semiconductor device wiring member, which has been cleared of a metal plate, for mounting a semiconductor element thereon, and is configured so that a first noble metal plating layer, which is to become internal terminals, is formed, at predetermined sites on one surface of a resin layer, with a lower surface thereof being uncovered at a same level as the one surface of the resin layer, a metal plating layer is formed on the first noble metal plating layer as having a same shape as the first noble metal plating layer, and a second noble metal plating layer, which is to become external terminals, is formed on a part of the metal plating layer, with an upper surface thereof being free from covering by other surface of the resin layer.

If, as in the semiconductor device wiring member according to the present invention, external terminals having a thickness different from internal terminals or wiring parts are preliminarily provided at sites corresponding to openings in a resin layer, which are to be provided in a manufacturing procedure of a semiconductor device in a case of a conventional semiconductor device substrate, and the internal terminals and the wiring parts are resin-sealed with only the external terminals being left uncovered on the other surface of the resin layer, unlike the conventional semiconductor device substrate, providing an insulating layer having openings in a connection surface for an external member is dispensable in the manufacturing procedure of a semiconductor device, and thus productivity is improved with a decreased number of processes in manufacturing a semiconductor device.

These points will be described in detail.

After trial and error, the applicant of the present invention has got to an idea of arranging the electrical connection surfaces of internal terminals and external terminals in a semiconductor device substrate used in manufacturing a semiconductor device to be opposite to the arrangement of the conventional semiconductor device substrate.

That is, the conventional semiconductor device substrate is configured so that, when a semiconductor device is to be manufactured, regarding external terminal surfaces, the metal-plate-side surface is used in uncovered state and, regarding internal terminal surfaces, the opposite-side surface with respect to the metal plate is used in uncovered state.

In contrast, in the semiconductor device substrate according to the first to third embodiments of the present invention, the configuration is made so that the plating layer constituting external terminals is made higher, from the metal plate, than the plating layer constituting internal terminals and wiring parts, on the basis of the idea that, when a semiconductor device is to be manufactured, regarding the external terminal surfaces, the opposite-side surface with respect to the metal plate is used in uncovered state, and, regarding the internal terminal surfaces, the metal-plate-side surface is used in uncovered state.

For this purpose, in the semiconductor device substrate according to the third embodiment of the present invention, on the metal plating layer that is to become internal terminals and on the metal plate, there is formed a permanent resist having openings at predetermined sites on the metal plating layer, and further formed on the metal plating layer positioned at the openings in the permanent resist is a second noble metal plating layer, which is to become external terminals.

In the semiconductor device wiring member according to the present invention, the configuration is made so that the plating layer constituting external terminals is made higher, from a metal plate that was used in manufacturing the semiconductor device substrate, than the plating layer constituting internal terminals and wiring parts, on the basis of the idea that, when a semiconductor device is to be manufactured, regarding external terminal surfaces, the opposite-side surface with respect to the metal plate used in manufacturing the semiconductor device substrate is used in uncovered state and, regarding internal terminal surfaces, the surface on the side of the metal plate used in manufacturing the semiconductor device substrate is used in uncovered state.

For example, if a side where terminals are provided of the semiconductor device substrate according to the first embodiment mode of the present invention is resin-sealed and the metal plate is removed by dissolution by etching or the like after the resin-sealing, a metal-plate removal-side surface of the first noble metal plating layer, which is to become internal terminals, gets uncovered after the removal of the metal plate, in an unevenness-free condition (level difference 1 µm or smaller) in conformance with the surface of the metal plate.

Also, for example, if the metal plate in the semiconductor device substrate according to the second or third embodiment mode of the present invention is removed by dissolution by etching or the like, a metal-plate removal-side surface of the first noble metal plating layer, which is to become internal terminals, gets uncovered after the removal of the metal plate, in an unevenness-free condition (level difference 1 µm or smaller) in conformance with the surface of the metal plate.

Also, for example, if the metal plate used in manufacturing the semiconductor device wiring member according to the present invention is removed by dissolution by etching or the like, a metal-plate removal-side surface of the first noble metal plating layer, which is to become internal terminals, gets uncovered after the removal of the metal plate, in an unevenness-free condition (level difference 1 µm or smaller) in conformance with the surface of the metal plate. This metal plate is a common rolled material used for leadframes and the like.

These metal plates are common rolled materials used for leadframes and the like.

Here, as in a semiconductor device using the conventional semiconductor device substrate, a semiconductor element is mounted on the first noble metal plating layer. Since the surface of the first noble metal plating layer is uncovered in the unevenness-free condition and thus the connection surface in its entirety is flat, connection is stabilized.

In this case, regarding the external terminals, the opposite-side surface with respect to the metal plate needs to get uncovered.

In this situation, the applicant of the present invention has devised the semiconductor device substrate according to the first embodiment mode of the present invention configured so that external terminals different in height from internal terminals or wiring parts are formed by, after application of a noble metal plating and a metal plating to a metal plate at sites that are to become the internal terminals, the external terminals and the wiring parts, unlike the conventional semiconductor device substrate, further layering, only at sites that are to become the external terminals, a noble metal plating (or a metal plating and a noble metal plating).

Also, the applicant of the present invention has devised the semiconductor device substrate according to the second embodiment mode of the present invention configured so that a resin layer is further formed on the semiconductor device substrate according to the first embodiment mode of the present invention at sites that are free from the second noble metal plating layer as leaving an upper surface of the second noble metal plating layer uncovered.

Also, the applicant of the present invention has devised the semiconductor device substrate according to the third embodiment mode of the present invention configured so that a permanent resist is formed on a metal plate and a metal plating layer that is to become internal terminals as having openings at predetermined sites on the metal plating layer and so that a second noble metal plating layer, which is to become external terminals, is formed on the metal plating layer at positions of the openings in the permanent resist, thereby to form the semiconductor device substrate according to the first embodiment mode of the present invention.

Also, the applicant of the present invention has devised the semiconductor device wiring member according to the present invention configured so that a resin layer is further formed on the semiconductor device substrate according to the first embodiment mode of the present invention at sites that are free from the second noble metal plating layer as leaving an upper surface of the second noble metal plating layer uncovered and so that the metal plate is removed by etching.

If, as in the semiconductor device substrate according to the first embodiment mode of the present invention, a level difference is provided between the external terminals and the internal terminals or the wiring parts, it is possible, in a subsequent manufacturing procedure for a semiconductor device, to resin-seal only the internal terminals and the wiring parts while leaving only the external terminals uncovered. Therefore, unlike the conventional semiconductor device substrate, processing a connection surface for an external member to form openings therein is dispensable in the manufacturing procedure of a semiconductor device, and thus productivity is improved with a decreased number of processes in manufacturing a semiconductor device.

Also, if, as in the semiconductor device substrate according to the second embodiment mode of the present invention, a level difference is provided between the external terminals and the internal terminals or the wiring parts and only the internal terminals and the wiring parts are resin-sealed while only the external terminals are left uncovered, unlike the conventional semiconductor device substrate, processing a connection surface for an external member to form openings therein is dispensable in the manufacturing procedure of a semiconductor device, and thus productivity is improved with a decreased number of processes in manufacturing a semiconductor device.

Also, if, as in the semiconductor device substrate according to the third embodiment mode of the present invention, a level difference is provided between the external terminals and the internal terminals or the wiring parts and only the internal terminals and the wiring parts are sealed with a permanent resist while only the external terminals are left uncovered, unlike the conventional semiconductor device substrate, processing a connection surface for an external member to form openings therein is dispensable in the manufacturing procedure of a semiconductor device, and thus productivity is improved with a decreased number of processes in manufacturing a semiconductor device.

Also, if, as in the semiconductor device wiring member according to the present invention, a level difference is provided between the external terminals and the internal terminals and the wiring parts and only the internal terminals and the wiring parts are resin-sealed and a surface at which only the external terminals are uncovered is provided on the other surface of the resin layer, unlike the conventional semiconductor device substrate, processes of removing the metal plate by etching and of forming openings in a connection surface for an external member are dispensable in the manufacturing procedure for a semiconductor device, and thus productivity is improved with a decreased number of processes in manufacturing a semiconductor device.

Also, a method according to the present invention for manufacturing a semiconductor device uses the above-mentioned semiconductor device substrate according to the present invention, and includes: a step of forming a resin layer as leaving a surface of a plating layer that is to become external terminals uncovered, upon using a semiconductor device substrate in which a plating layer that is to become internal terminals is formed on a metal plate, the plating layer that is to become the external terminals is formed on a part of the plating layer that is to become the internal terminals, and in which a height of the surface of the plating layer that is to become the external terminals from a surface of the metal plate is larger than a height of a surface of other plating layer from the surface of the metal plate; a step of fabricating a wiring member in which the plating layers as formed are held by the resin layer, by removing the metal plate after formation of the resin layer with the surface of the plating layer that is to become the external terminals being left uncovered; and a step of mounting a semiconductor element on the wiring member.

Also, a method according to the present invention for manufacturing a semiconductor device uses the above-mentioned semiconductor device substrate according to the present invention, and includes: a step of forming a resin layer as leaving a surface of a plating layer that is to become external terminals uncovered, upon using a semiconductor device substrate in which a plating layer that is to become internal terminals is formed on a metal plate, the plating layer that is to become the external terminals is formed on a part of the plating layer that is to become the internal terminals, and in which a height of the surface of the plating layer that is to become the external terminals from a surface of the metal plate is larger than a height of a surface of other plating layer from the surface of the metal plate; a step of fabricating a wiring member in which the plating layers as formed are held by the resin layer, by removing the metal plate after formation of the resin layer with the surface of the plating layer that is to become the external terminals being left uncovered; and a step of mounting a semiconductor element on a former metal-plate-side surface of the plating layer that is to become the internal terminals of the wiring member as fabricated.

Also, a method according to the present invention for manufacturing a semiconductor device uses the above-mentioned semiconductor device substrate according to the present invention, and includes: a step of forming a resin layer as leaving a surface of a plating layer that is to become external terminals uncovered, on a semiconductor device substrate in which plating layer that is to become internal terminals is formed on a metal plate, the plating layer that is to become the external terminals is formed on a part of the plating layer that is to become the internal terminals, and in which a height of the surface of the plating layer that is to become the external terminals from a surface of the metal plate is larger than a height of a surface of other plating layer from the surface of the metal plate; a step of fabricating a wiring member in which the plating layers as formed are held by the resin layer, by removing the metal plate after formation of the resin layer with the surface of the plating layer that is to become the external terminals being left uncovered; a step of mounting a semiconductor element on a former metal-plate-side surface of the plating layer that is to become the internal terminals of the wiring member as fabricated, to establish conduction between electrodes of the semiconductor element and the internal terminals; and a step of resin-sealing a portion on which the semiconductor element is mounted.

A semiconductor device substrate used in the method according to the present invention for manufacturing a semiconductor device is a semiconductor device substrate that is to become a semiconductor device wiring member after removal of a metal plate, for mounting a semiconductor element thereon, and is configured so that there are formed, from the metal-plate side, a first noble metal plating layer, which is to become internal terminals, at predetermined sites on the metal plate, a metal plating layer having a same shape as the first noble metal plating layer on the first noble metal plating layer, further on a part of the metal plating layer a second metal plating layer, and, on the second metal plating layer a second noble metal plating layer, which is to become external terminals, having a same shape as the second metal plating layer, and so that a height of a surface of the second noble metal plating layer from a surface of the metal plate is larger than a height of a surface of the metal plating layer from the surface of the metal plate.

Since this semiconductor device substrate is preliminarily provided with external terminal parts having a thickness different from internal terminals or wiring parts, it is easy, in a manufacturing procedure of a semiconductor device, to resin-seal the internal terminals and the wiring parts while leaving only the external terminals uncovered. Therefore, unlike the conventional semiconductor device substrate, providing an insulating layer having openings in a connection surface for an external member is dispensable in the manufacturing procedure of a semiconductor device, and thus productivity is improved with a decreased number of processes in manufacturing a semiconductor device.

This point will be described in detail.

As stated above, the applicant of the present invention has got, after trial and error, to the idea of arranging the electrical connection surfaces of internal terminals and external terminals in a semiconductor device substrate used in manufacturing a semiconductor device to be opposite to the arrangement of the conventional semiconductor device substrate.

That is, the conventional semiconductor device substrate is configured so that, when a semiconductor device is to be manufactured, regarding external terminal surfaces, the metal-plate-side surface is used in uncovered state and, regarding internal terminal surfaces, the opposite-side surface with respect to the metal plate is used in uncovered state.

In contrast, in the semiconductor device substrate used in the present invention, the configuration is made so that, when a semiconductor device is to be manufactured, regarding external terminal surfaces, the opposite-side surface with respect to the metal plate is used in uncovered state and, regarding internal terminal surfaces, the metal-plate-side surface is used in uncovered state, and the plating layer constituting external terminals is made higher, from the metal plate, than the plating layer constituting internal terminals and wiring parts.

For example, if a side where terminals are provided, of the semiconductor device substrate used for the method according to the present invention for manufacturing a semiconductor device, is resin-sealed and the metal plate is removed by dissolution by etching or the like after the resin-sealing, a metal-plate removal-side surface of the first noble metal plating layer, which is to become internal terminals, gets uncovered after the removal of the metal plate, in an unevenness-free condition (level difference 1 μm or smaller) in conformance with the surface of the metal plate. This metal plate is a common rolled material used for leadframes and the like.

Here, as in a semiconductor device using the conventional semiconductor device substrate, a semiconductor element is mounted on the first noble metal plating layer. Since the surface of the first noble metal plating layer is uncovered in the unevenness-free condition, the connection surface in its entirety is flat and gives no tilt to the semiconductor element, as well as the plurality of internal terminal parts has uniform height and thus achieves stable connection with electrodes of the semiconductor element.

Regarding the external terminal parts, it is necessary to uncover the opposite-side surface with respect to the metal plate. A resin layer that leaves the surface of the external terminal parts uncovered can be easily formed and a process of uncovering the surface of the external terminal parts is made dispensable by use of a semiconductor device substrate that is configured to have external terminals different in height from internal terminals or wiring parts formed, after application of a noble metal plating and a metal plating to a metal plate at sites that are to become the internal terminals, the external terminals and the wiring parts, by further layering a metal plating and a noble metal plating only at sites that are to become the external terminals, unlike the conventional semiconductor device substrate.

Another method according to the present invention for manufacturing a semiconductor device uses the above-mentioned semiconductor device substrate according to the present invention, and includes: a step of removing a metal plate, from a semiconductor device substrate in which a permanent resist layer of a predetermined thickness is formed on a metal plate, a plating layer that is to become internal terminals is formed in the permanent resist layer as fronting the metal plate, a plating layer that is to become external terminals is formed on a part of the plating layer that is to become the internal terminals, and in which only an upper surface of the plating layer that is to become the external terminals is left uncovered at openings in an upper surface of the permanent resist layer, thereby to fabricate a wiring member in which the plating layers are fixed by the permanent resist layer; and a step of mounting a semiconductor element on a metal-plate removal side of the wiring member as fabricated.

Another method according to the present invention for manufacturing a semiconductor device uses the above-mentioned semiconductor device substrate, and includes: a step of removing a metal plate from a semiconductor device substrate in which a permanent resist layer of a predetermined thickness is formed on the metal plate, a plating layer that is to become internal terminals is formed in a predetermined pattern in the permanent resist layer on a metal-plate side, a plating layer that is to become external terminals is formed on a part of the plating layer that is to become the internal terminals, and in which only an upper surface of the plating layer that is to become the external terminals is left uncovered at openings in an upper surface of the permanent resist layer, thereby to prepare a wiring member in which the plating layers are fixed by the permanent resist layer; a step of mounting a semiconductor element on a metal-plate removal side of the wiring member as prepared, to establish conduction at portions, as being uncovered on the wiring member, of the plating layer that is to become the internal terminals with electrodes of the semiconductor element; and a step of resin-sealing a semiconductor-element mount side.

A semiconductor device substrate used in the another method according to the present invention for manufacturing a semiconductor device is a semiconductor device substrate that is to become a semiconductor device wiring member after removal of a metal plate, for mounting a semiconductor element thereon, and is configured so that a permanent resist layer of a predetermined thickness is formed on the metal plate, that a first noble metal plating layer, which is to become internal terminals, is formed at predetermined sites on the metal plate, on a metal-plate side in the permanent resist layer, that a metal plating layer having a same shape as the first noble metal plating layer is formed on the first noble metal plating layer, that a second noble metal plating layer, which is to become external terminals, is further formed on a part of the metal plating layer, or a second metal plating layer having a same shape as the second noble metal plating layer is formed between the metal plating layer and the second noble metal plating layer, and so that only an upper surface of the plating layer that is to become the external terminals is left uncovered at openings in an upper surface of the permanent resist layer. This metal plate is a common rolled material available for use for leadframes.

Removal of the metal plate from this semiconductor device substrate forms a wiring member in which plating layers are fixed by a permanent resist; a plating layer that is to become internal terminals is formed in the permanent resist layer as fronting the metal plate, a plating layer that is to become external terminals is formed on a part of the plating layer that is to become the internal terminals, and only an opposite-side surface of the plating layer that is to become the external terminals is uncovered at openings in the permanent resist layer.

In another method according to the present invention for manufacturing a semiconductor device, assembling is made using the above-mentioned wiring member, by mounting a semiconductor element on a side that formerly adjoined the metal plate.

Since this wiring member having the plating layers fixed by the permanent resist is used in the state where, regarding the external terminals, the opposite-side surface thereof with respect the metal plate is uncovered and, regarding the internal terminals, the metal-plate-side surface thereof is uncovered, the surface for mounting a semiconductor element thereof is formed to be in an unevenness-free condition (level difference 1 μm or smaller) in conformance with the surface of the metal plate.

In another method according to the present invention for manufacturing a semiconductor device, a semiconductor element is mounted on the plating layer that is to become internal terminals in the semiconductor-element mount surface of this wiring member. Since the surface of the metal plating layer that is to become internal terminals is uncovered in the unevenness-free condition, the connection surface in its entirety is flat and gives no tilt to the semiconductor element, as well as the plurality of internal terminal parts has uniform height and thus achieves stable connection with electrodes of the semiconductor element.

In this way, in the another method according to the present invention for manufacturing a semiconductor device, mounting a semiconductor element on the metal-plate removal side of this wiring member can prevent the semiconductor element as mounted from tilting and preclude conduction failure resulting from a poor connection in bonding or the like. Further, since, on the external-terminal side of this wiring member, only the faces of the external terminals have already got uncovered at openings in the upper surface of the permanent resist, the process of forming openings to uncover the faces of the external terminal parts as in the conventional method for manufacturing a semiconductor device is dispensable.

In reference to the drawings, the embodiment modes of the present invention will be described below.

First Embodiment Mode

Figure 1B:
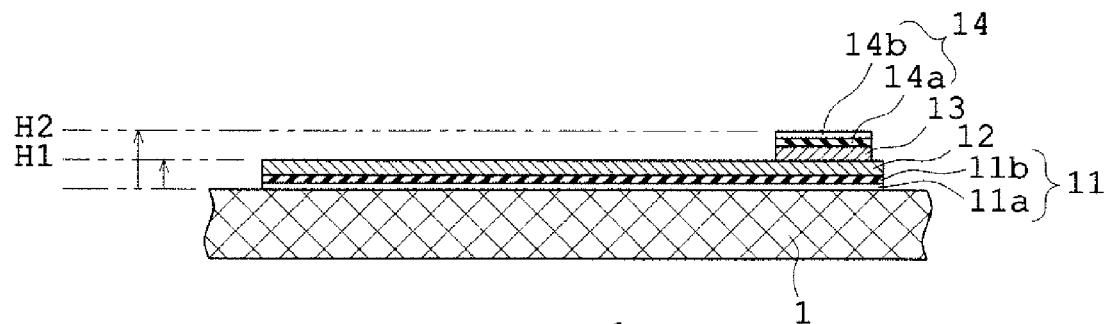

FIG. 1A and FIG. 1B are diagrams that show a configuration of a semiconductor device substrate according to a first embodiment mode of the present invention; FIG. 1A is a partial plan view as viewed from an external-terminal side, and FIG. 1B is a cross-sectional view taken along a line A-A in FIG. 1A. FIGS. 2A-2I are explanatory diagrams that show a manufacturing procedure for the semiconductor device substrate shown in FIG. 1A and FIG. 1B. FIGS. 3A-3E are plan views that show the state transition of the semiconductor device substrate in the manufacturing procedure.

As shown in FIG. 1B, the semiconductor device substrate according to the first embodiment mode is configured so that a first noble metal plating layer 11, which is to become internal terminals, is formed at predetermined sites on a metal plate 1 defined by a predetermined boundary, a metal plating layer 12 is formed on the first noble metal plating layer 11 as having a same shape as the first noble metal plating layer 11 (i.e., the metal plating layer 12 has a shape defined by a boundary coinciding with the predetermined boundary of the first noble metal plating layer 11), a second metal plating layer 13 is further formed on a part of the metal plating layer 12, and a second noble metal plating layer 14, which is to become external terminals, is formed on the second metal plating layer 13 as having a same shape as the second metal plating layer 13.

The metal plate 1 is configured of, for example, a copper plate.

The first noble metal plating layer 11 is configured of, for example, an Au plating layer 11a and a Pd plating layer 11b formed in order from the metal-plate-1 side. Thus, as illustrated in, for example, FIG. 1B, the Ag surface of the first noble metal plating layer 11 is in contact with the surface of the metal plate 1 (in other words, the Ag surface lies on a reference plane).

The metal plating layer 12 and the second metal plating layer 13 are configured of, for example, Ni plating layers.

The second noble metal plating layer 14 is configured of, for example, a Pd plating layer 14a and an Au plating layer 14b formed in order from the metal-plate-1 side.

The height H2 of the surface of the second noble metal plating layer 14 (i.e. the surface of the Au plating layer 14b) from the surface of the metal plate 1 is larger than the height H2 of the surface of the metal plating layer 12 from the surface of the metal plate 1.

The semiconductor device substrate according to the first embodiment mode thus configured can be manufactured, for example, as follows. Description of pre-treatment and post-treatment including chemical cleaning, aqueous washing and the like carried out in each step of the manufacturing is omitted for convenience's sake.

Figure 2A:
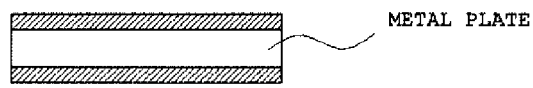
FIGS. 2A-2I are explanatory diagrams that show a manufacturing procedure for the semiconductor device substrate shown in FIG. 1A and FIG. 1B.
Figure 3A:
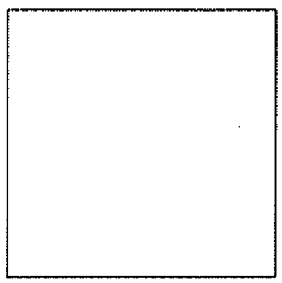
FIGS. 3A-3E are plan views that show the state transition of the semiconductor device substrate in the manufacturing procedure of FIGS. 2A-2I.

First, as shown in FIG. 2A, a dry film resist for a resist mask is made to laminate both sides of a metal plate serving as a substrate. At this time, as shown in FIG. 3A, a plating layer is not formed on the metal plate.

Figure 2B:
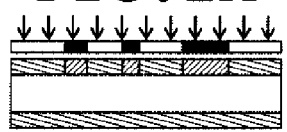
Figure 2C:
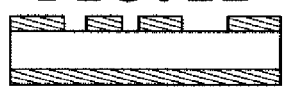

Next, as shown in FIG. 2B, the dry film resist on the front surface side is exposed and developed upon use of a glass mask that carries a pattern (here, referred to as a pattern A) for forming the stem portions of internal terminals, wiring parts and external terminals at predetermined sites, and the dry film resist on the back surface side is exposed and developed upon use of a glass mask that allows the entire surface to be exposed. Then, as shown in FIG. 2C, a resist mask carrying the pattern A is formed on the front surface, and a resist mask covering the entire surface is formed on the back surface. The exposure and development is carried out by a conventional known method. For example, a dry film resist as covered with a glass mask is irradiated with ultraviolet rays, for lowering its solubility in a developer at sites irradiated with the ultraviolet rays passing through the glass mask and then removing the rest of the dry film resist other than these sites, thereby to form a resist mask. Here, while a negative-type dry film resist is used as the resist, a negative-type liquid resist may be used for formation of a resist mask. Further, a dry film resist or liquid resist of positive type may be used, for increasing its solubility in a developer at sites irradiated with the ultraviolet rays passing through a glass mask and then removing these sites, thereby to form a resist mask. Further, a solder resist may be used as a resist for forming a resist mask.

Then, Au plating and Pd plating are respectively applied to the sites not covered with the resist mask on the metal plate, so that, for example, an Au plating layer 11a and a Pd plating layer 11b are formed in this order to have predetermined thicknesses respectively, as the first noble metal plating layer 11.

Figure 2D:
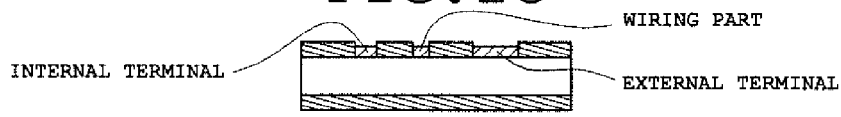

After that, Ni plating is applied to the Pd plating layer 11b, so that, as the metal plating layer 12, a Ni plating layer, for example, is formed as having a same shape in a plan view as the noble metal plating layer. FIG. 2D shows the state at this stage.

Figure 3B:
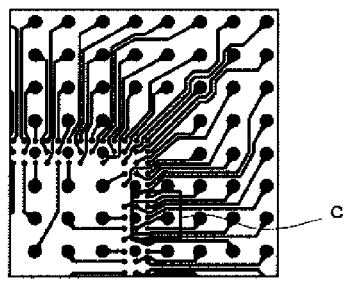
Figure 3C:
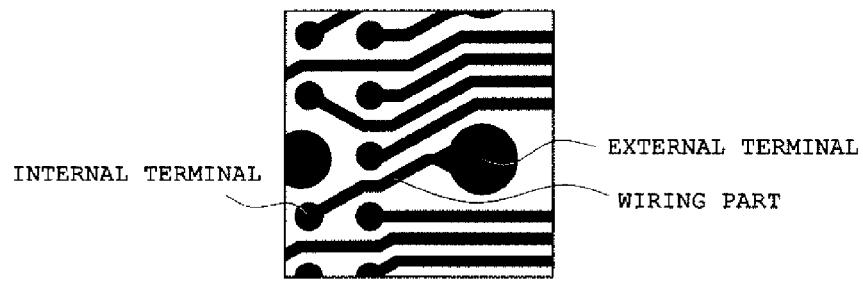
Figure 3D:
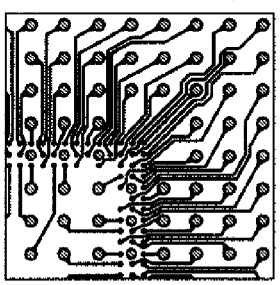
Figure 3E:
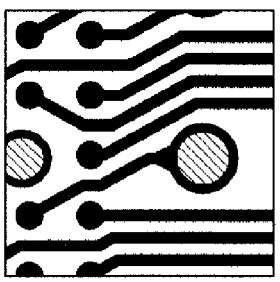

Then, the resist masks on both sides are peeled off. FIG. 3B is a diagram that shows a plating layer in the pattern A applied to the semiconductor device substrate at this stage, and FIG. 3C is a diagram that shows one region enclosed with the rectangle in FIG. 3B upon enlarging it. Then, as shown in FIG. 3E, a dry film resist is made to laminate the both surfaces, which have been cleared of the resist masks.

Figure 2E:
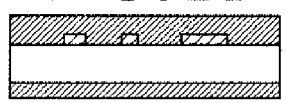
Figure 2F:
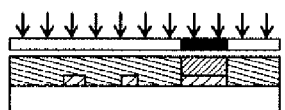
Figure 2G:
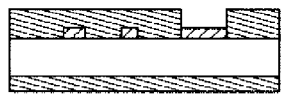

Then, as shown in FIG. 2F, the dry film resist on the front surface side is exposed and developed upon use of a glass mask that carries a pattern (here, referred to as a pattern B) for forming a plating layer additionally layered on sites that are a part of the Ni plating layer previously formed and that are to become the external terminals, and the dry film resist on the back surface side is exposed and developed upon use of a glass mask that allows the entire surface to be exposed. Then, as shown in FIG. 2G, a resist mask carrying the pattern B is formed on the front surface, and a resist mask covering the entire surface is formed on the back surface.

Then, Ni plating is applied to the surface not covered with the resist mask, of the Ni plating layer constituting the metal plating layer 12, so that a Ni plating layer, for example, is formed as the second metal plating layer 13.

Figure 2H:
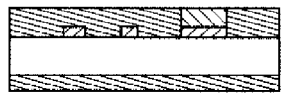

Then, Pd plating and Au plating are respectively applied to the surface of the Ni plating layer constituting the second metal plating layer 12, so that, for example, a Pd plating layer 14a and an Au plating layer 14b are formed in this order to have predetermined thicknesses respectively, as the second noble metal plating layer 14. FIG. 2H shows the state at this stage. Pd plating and Au plating may be respectively applied without providing the second metal plating layer 13 so that, for example, a Pd plating layer 14a and an Au plating layer 14b are formed in this order to have predetermined thicknesses respectively, as the second noble metal plating layer 14.

Figure 2I:
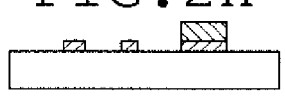

Then, as shown in FIG. 2I, peeling off of the resist masks on both sides completes the semiconductor device substrate of this embodiment mode. FIG. 3D is a diagram that shows the pattern-B plating layer applied to the semiconductor device substrate at this stage, and FIG. 3E is a diagram that shows one region enclosed with the rectangle in FIG. 3D upon enlarging it.

Manufacturing of a semiconductor device that uses the semiconductor device substrate according to the first embodiment mode thus manufactured is conducted as follows. FIGS. 4A-4G are explanatory diagrams that show one example of manufacturing procedure for a resin-sealed type semiconductor device using the semiconductor device substrate according to the first embodiment mode manufactured via the manufacturing procedure shown in FIGS. 2A-2I.

Figure 4A:
FIGS. 4A-4G are explanatory diagrams that show one example of manufacturing procedure for a resin-sealed type semiconductor device using the semiconductor device substrate according to the first embodiment mode manufactured via the manufacturing procedure shown in FIGS. 2A-2I.
Figure 4B:
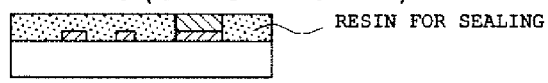
Figure 4B:

First, on the side where the plating layers corresponding to internal terminals, wiring parts and external terminals are projected on the metal plate of the semiconductor device substrate shown in FIG. 4A, with the surface of the noble metal plating layer 14, which is to become external terminals, being left uncovered, the remaining sites are sealed with a resin as shown in FIG. 4B. FIG. 4B shows the state of resin-sealing in a case where there is used a semiconductor device substrate configured so that, on the surface of the Ni plating constituting the metal plating layer 12, the second metal plating layer 13 is not provided but the noble metal plating layer 14 as the second noble metal plating layer is provided. In a case where there is used a semiconductor device substrate configured so that the second metal plating layer 13 is provided on the surface of the Ni plating constituting the metal plating layer 12 and the noble metal plating layer 14 as the second noble metal plating layer is provided on the surface of the second metal plating layer 13, when resin-sealing is made, the noble metal plating layer 14 projects from the resin surface as shown in FIG. 2B'. In the following explanations, for convenience's sake, the semiconductor device substrate provided with the noble metal plating layer 14 as the second noble metal plating layer without being provided with the second metal plating layer 13 is to be used. If the semiconductor device substrate provided with the noble metal plating layer 14 as the second noble metal plating layer without being provided with the second metal plating layer 13 is used, owing to unevenness of the height of the terminals caused by plating in a terminal pattern, the resin may flow into the external terminal surface. In this situation, the external terminal surface should be uncovered by polishing the surface of the sealing resin.

Figure 4C:

Then, etching is applied to the metal plate of the semiconductor device substrate, to remove the metal plate by dissolution or the like. As a result, the surfaces of the internal terminals, the wiring parts and the external terminals are uncovered at the same level as the resin surface. FIG. 4C shows the state at this stage.

Figure 4D:
Figure 4E:

Then, a semiconductor element is mounted on the internal terminal surface side, which has emerged by removal of the metal plate, and electrodes of the semiconductor element are connected with the internal terminals, which are uncovered at the same level as the resin surface. In this situation, according to the flip chip method, the electrodes of the semiconductor element and the internal terminals are connected as shown in FIG. 4D. According to the wire method, the electrodes of the semiconductor element and the internal terminals are connected via wires as shown in FIG. 4E. Since the surfaces of the internal terminals, which have got uncovered through the manufacturing process of the semiconductor device shown in FIGS. 4A-4C using the semiconductor device substrate of the first embodiment mode, are at the same level as the resin surface, the semiconductor element can be stably mounted. For convenience's sake, explanation of die bonding for fixing the semiconductor element is omitted here.

Figure 4F:
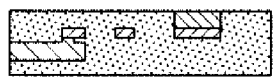

Then, as shown in FIG. 4F, the surface on which the semiconductor element is mounted is sealed with a resin. Thereby, the semiconductor device is completed. FIGS. 4A-4F are shown without changing the vertical direction of the semiconductor device substrate.

Figure 4G:
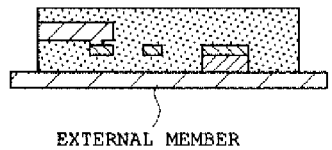

The semiconductor device as completed is mounted on an external member upon the vertical directions being inverted from the orientation shown in FIG. 4F. In this case, since only the external terminals are left uncovered in reference to the resin, they can be easily connected with connecting terminals provided on the external member. FIG. 4G shows the state at this stage.

Second Embodiment Mode

Figure 5A:
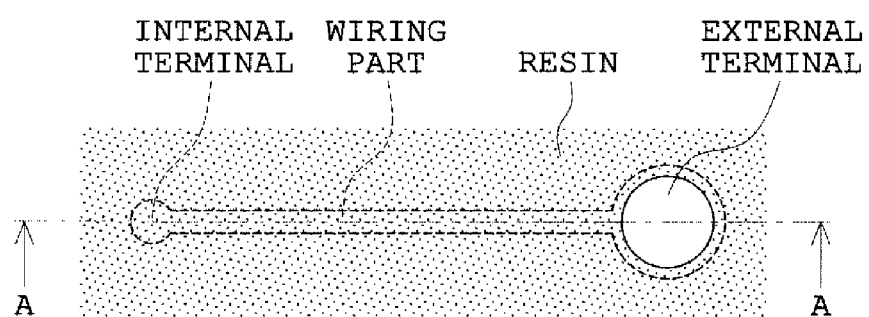
FIG. 5A and FIG. 5B are diagrams that show a configuration of a semiconductor device substrate according to a second embodiment mode of the present invention.
Figure 5B:
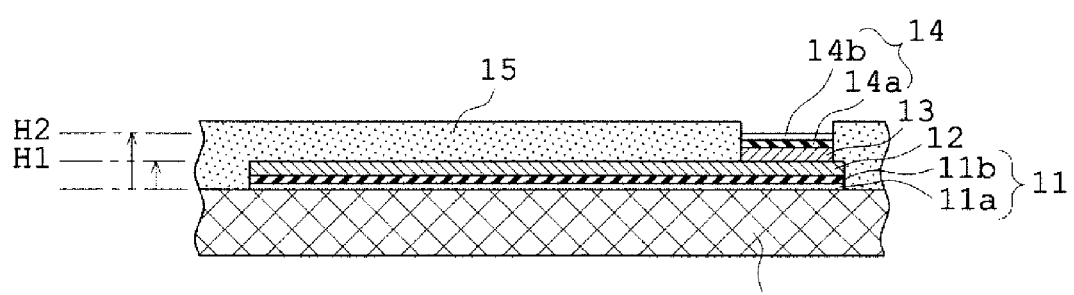

FIG. 5A and FIG. 5B are diagrams that show a configuration of a semiconductor device substrate according to a second embodiment mode of the present invention; FIG. 5A is a partial plan view as viewed from an external-terminal side, and FIG. 5B is a cross-sectional view taken along a line A-A in FIG. 5A. FIGS. 6A-6J' are explanatory diagrams that show a manufacturing procedure for the semiconductor device substrate shown in FIG. 5A and FIG. 5B.

As shown in FIG. 5B, the semiconductor device substrate according to the second embodiment mode is configured so that, in addition to the configuration substantially the same as the semiconductor device substrate according to the first embodiment mode, a resin layer 15 is further formed at sites that are free from the second noble metal plating layer 14 on the metal plate 1 and the metal plating layer 12, as leaving an upper surface of the second noble metal plating layer 14 uncovered.

The semiconductor device substrate according to the second embodiment mode thus configured can be manufactured, for example, as follows. Description of pre-treatment and post-treatment including chemical cleaning, aqueous washing and the like carried out in each step of the manufacturing is omitted for convenience's sake.

The steps from laminating of both sides of a metal plate, as a substrate, with a dry film resist for resist masks (FIG. 6A) to peeling-off of the dry film resist on the both sides (FIG. 6I) are substantially the same as the steps for manufacturing the semiconductor device substrate according to the first embodiment mode shown in FIGS. 2A-2I.

Then, on the side where the plating layers corresponding to internal terminals, wiring parts and external terminals are projected on the metal plate, with the surface of the noble metal plating layer 14, which is to become external terminals, being left uncovered, the remaining sites are sealed with a resin as shown in FIG. 6J. FIG. 6J shows the state of resin-sealing in a case where there is used a metal plate configured so that, on the surface of the Ni plating constituting the metal plating layer 12, the second metal plating layer 13 is not provided but the noble metal plating layer 14 as the second noble metal plating layer is provided. In a case where there is used a metal plate configured so that the second metal plating layer 13 is provided on the surface of the Ni plating constituting the metal plating layer 12 and the noble metal plating layer 14 as the second noble metal plating layer is provided on the surface of the second metal plating layer 13, when resin-sealing is made, the noble metal plating layer 14 projects from the resin surface as shown in FIG. 6J'. For convenience's sake, the metal plate provided with the noble metal plating layer 14 as the second noble metal plating layer without being provided with the second metal plating layer 13 is to be used. If the metal plate provided with the noble metal plating layer 14 as the second noble metal plating layer without being provided with the second metal plating layer 13 is used, owing to unevenness of the height of the terminals caused by plating in a terminal pattern, the resin may flow into the external terminal surface. In this situation, the external terminal surface should be uncovered by polishing the surface of the sealing resin. Thereby, the semiconductor device substrate of this embodiment mode is completed.

Manufacturing of a semiconductor device that uses the semiconductor device substrate according to the second embodiment mode thus manufactured is conducted as follows. FIGS. 7A-7F are explanatory diagrams that show one example of manufacturing procedure for a resin-sealed type semiconductor device using the semiconductor device substrate according to the second embodiment mode manufactured via the manufacturing procedure shown in FIGS. 6A-6J'. FIG. 7A shows a semiconductor device substrate configured so that, on the surface of the Ni plating constituting the metal plating layer 12, the second metal plating layer 13 is not provided but the noble metal plating layer 14 as the second noble metal plating layer is provided, and so that predetermined sites are resin-sealed. In a case where there is used a semiconductor device substrate configured so that the second metal plating layer 13 is provided on the surface of the Ni plating constituting the metal plating layer 12 and the noble metal plating layer 14 as the second noble metal plating layer is provided on the surface of the second metal plating layer 13, and so that predetermined sites are resin-sealed, the noble metal plating layer 14 projects from the resin surface as shown in FIG. 7A'. In the following explanations, for convenience's sake, the semiconductor device substrate configured so that the noble metal plating layer 14 as the second noble metal plating layer is provided but the second metal plating layer 13 is not provided and predetermined sites are resin-sealed is to be used.

First, etching is applied to the metal plate of the semiconductor device substrate shown in FIG. 7A, to remove the metal plate by dissolution or the like. As a result, the surfaces of the internal terminals, the wiring parts and the external terminals are uncovered at the same level as the resin surface. FIG. 7B shows the state at this stage.

The subsequent respective steps of mounting a semiconductor element on the internal terminal surface side (FIG. 7C, FIG. 7D), resin-sealing the semiconductor element mount surface (FIG. 7E), and mounting the semiconductor device as completed on an external member (FIG. 7F) are substantially the same as the steps shown in FIGS. 4D-4G for manufacturing a semiconductor device using the semiconductor device substrate of the first embodiment mode.

Third Embodiment Mode

Figure 8A:
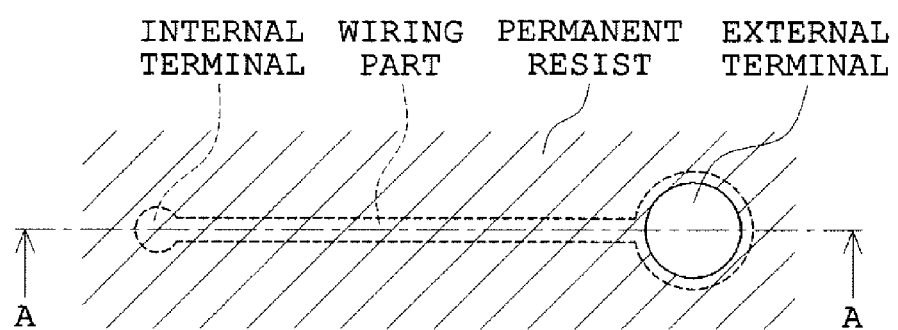
FIG. 8A and FIG. 8B are diagrams that show a configuration of a semiconductor device substrate according to a third embodiment mode of the present invention.
Figure 8B:
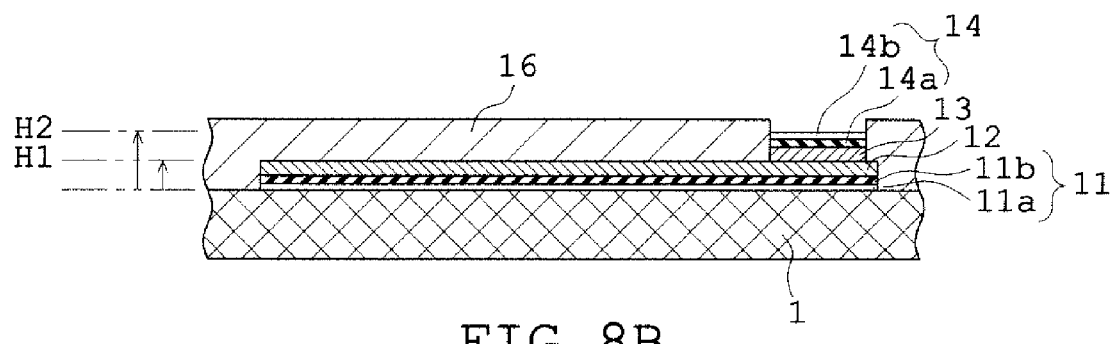

FIG. 8A and FIG. 8B are diagrams that show a configuration of a semiconductor device substrate according to a third embodiment mode of the present invention; FIG. 8A is a partial plan view as viewed from an external-terminal side, and FIG. 8B is a cross-sectional view taken along a line A-A in FIG. 8A. FIGS. 9A-9J are explanatory diagrams that show a manufacturing procedure for the semiconductor device substrate shown in FIG. 8A and FIG. 8B.

As shown in FIG. 8B, the semiconductor device substrate according to the third embodiment mode is configured so that a permanent resist 16 is formed on the metal plate 1 and the metal plating layer 11 as having openings at predetermined sites of the metal plating layer 11, and the second metal plating layer 13 is formed on the metal plating layer 11 at positions of the openings in the permanent resist 16. The other configurations are substantially the same as the semiconductor device substrate of the first embodiment mode.

The semiconductor device substrate according to the third embodiment mode thus configured can be manufactured, for example, as follows. Description of pre-treatment and post-treatment including chemical cleaning, aqueous washing and the like carried out in each step of the manufacturing is omitted for convenience's sake.

The steps from laminating of both sides of a metal plate, as a substrate, with a dry film resist for resist masks (FIG. 9A) to formation of the metal plating layer 11 and the metal plating layer 12 (FIG. 9D) are substantially the same as the steps for manufacturing the semiconductor device substrate according to the first embodiment mode shown in FIGS. 2A-2D.

Then, the resist masks on the both surfaces are peeled off. After that, as shown in FIG. 9E, a film-type permanent resist is made to laminate the side of the surface on which the plating layers are formed, and a dry film resist similar to that used in FIG. 9A is made to laminate the back surface side.

Then, as shown in FIG. 9F, the front surface side is exposed and developed upon use of a glass mask that carries a pattern (here, referred to as a pattern B) for forming a plating layer additionally layered on sites that are a part of the Ni plating layer previously formed and that are to become the external terminals, and the dry film resist on the back surface side is exposed and developed upon use of a glass mask that allows the entire surface to be exposed. Then, as shown in FIG. 9G, a resist mask made of the permanent resist (the permanent resist 16 shown in FIG. 8A and FIG. 8B) carrying the pattern B is formed on the front surface, and a resist mask covering the entire surface is formed on the back surface.

Then, Ni plating is applied to the surface not covered with the resist mask, of the Ni plating layer constituting the metal plating layer 12, so that a Ni plating layer, for example, is formed as the second metal plating layer 13.

Then, Pd plating and Au plating are respectively applied to the surface of the Ni plating layer constituting the second metal plating layer 12, so that, for example, a Pd plating layer 14a and an Au plating layer 14b are formed in this order to have predetermined thicknesses respectively, as the second noble metal plating layer 14. FIG. 9H shows the state at this stage. Pd plating and Au plating may be respectively applied without providing the second metal plating layer 13 so that, for example, a Pd plating layer 14a and an Au plating layer 14b are formed in this order to have predetermined thicknesses respectively, as the second noble metal plating layer 14. FIG. 9I shows the state at this stage.

Then, as shown in FIG. 9J, peeling off of the resist mask on the back surface completes the semiconductor device substrate of this embodiment mode.

Manufacturing of a semiconductor device that uses the semiconductor device substrate according to the third embodiment mode thus manufactured is conducted as follows. FIGS. 10A-10G are explanatory diagrams that show one example of manufacturing procedure for a resin-sealed type semiconductor device using the semiconductor device substrate according to the third embodiment mode manufactured via the manufacturing procedure shown in FIGS. 9A-9J.

Figure 10A:
FIGS. 10A-10G are explanatory diagrams that show one example of manufacturing procedure for a resin-sealed type semiconductor device using the semiconductor device substrate according to the third embodiment mode manufactured via the manufacturing procedure shown in FIGS. 9A-9J.
Figure 10B:

First, etching is applied to the metal plate of the semiconductor device substrate shown in FIG. 10A, to remove the metal plate by dissolution or the like. As a result, the surfaces of the internal terminals, the wiring parts and the external terminals are uncovered at the same level as the permanent resist surface. FIG. 10B shows the state at this stage.

Figure 10C:
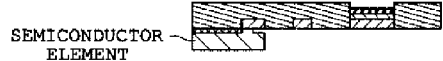
Figure 10D:

Then, a semiconductor element is mounted on the internal terminal surface side, which has emerged by removal of the metal plate, and electrodes of the semiconductor element are connected with the internal terminals, which are uncovered at the same level as the permanent resist surface. In this situation, according to the flip chip method, the electrodes of the semiconductor element and the internal terminals are connected as shown in FIG. 10C. According to the wire method, the electrodes of the semiconductor element and the internal terminals are connected via wires, as shown in FIG. 10D. Since the surfaces of the internal terminals, which have got uncovered through the steps for manufacturing the semiconductor device shown in FIG. 10A and FIG. 10B using the semiconductor device substrate of the third embodiment mode, are at the same level as the permanent resist surface, the semiconductor element can be stably mounted. For convenience's sake, explanation of die bonding for fixing the semiconductor element is omitted here.

Figure 10E:

Then, as shown in FIG. 10E, the surface on which the semiconductor element is mounted is sealed with a resin. Thereby, the semiconductor device is completed. FIGS. 10A-10F are shown without changing the vertical direction of the semiconductor device substrate.

Figure 10F:
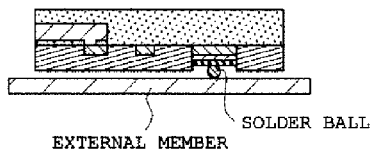

The semiconductor device as completed is mounted on an external member upon the vertical directions being inverted from the orientation shown in FIG. 10E. In this case, since only the external terminals are left uncovered in reference to the permanent resist, they can be easily connected with connecting terminals provided on the external member. FIG. 10F shows the state at this stage.

Fourth Embodiment Mode

Figure 11A:
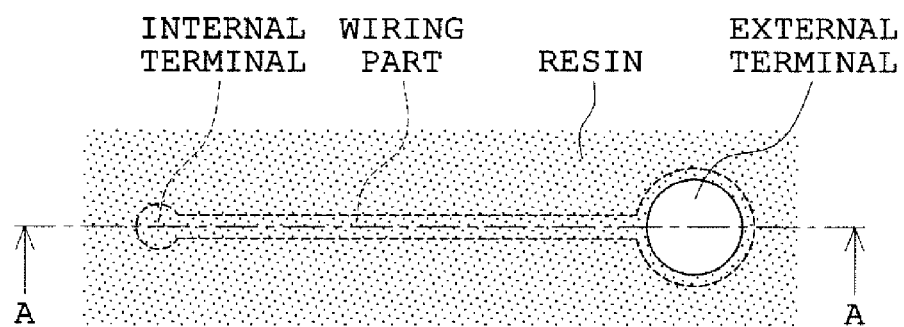
FIG. 11A and FIG. 11B are diagrams that show a configuration of a semiconductor device wiring member according to a fourth embodiment mode of the present invention.
Figure 11B:
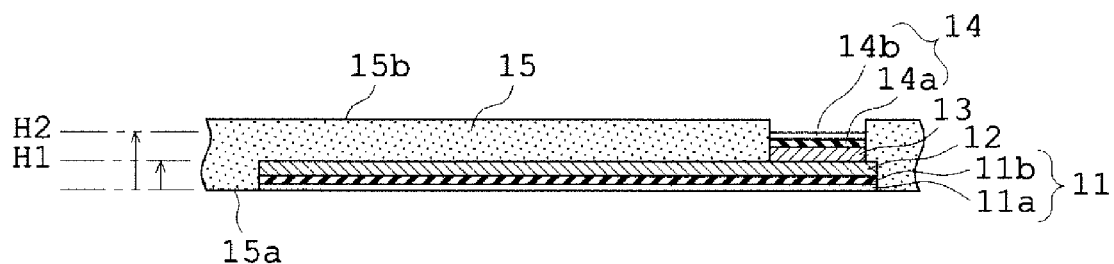

FIG. 11A and FIG. 11B are diagrams that show a configuration of a semiconductor device wiring member according to a fourth embodiment mode of the present invention; FIG. 11A is a partial plan view as viewed from an external-terminal side, and FIG. 11B is a cross-sectional view taken along a line A-A in FIG. 11A. FIGS. 12A-12K are explanatory diagrams that show a manufacturing procedure for the semiconductor device substrate shown in FIG. 11A and FIG. 11B.

As shown in FIG. 11B, the semiconductor device wiring member according to the fourth embodiment mode is configured so that the first metal plating layer 11, which is to become the internal terminals, is formed at predetermined sites of one surface of the resin layer 15, with a lower surface thereof being uncovered at a same level as the one surface of the resin layer 15, the metal plating layer 12 is formed on the first noble metal plating layer as having a same shape as the first noble metal plating layer 11, the second plating layer 13 is formed on a part of the metal plating layer 12, and so that the second noble metal plating layer, which is to become the external terminals, is formed on the metal plating layer 13 as having a same shape as the metal plating layer 13, with an upper surface thereof being free from covering by the other surface 15b of the resin layer 15.

The first noble metal plating layer 11 is configured of, for example, an Au plating layer 11a and a Pd plating layer 11b formed in order from the side of the one surface 15a of the resin layer 15.

The metal plating layer 12 and the second metal plating layer 13 are configured of, for example, Ni plating layers.

The second noble metal plating layer 14 is configured of, for example, a Pd plating layer 14a and an Au plating layer 14b formed in order from the side of the one surface 15a of the resin layer 15.

The height H2 of the surface of the second noble metal plating layer 14 (i.e. the surface of the Au plating layer 14b) from the one surface 15a of the resin layer 15 is larger than the height H2 of the surface of the metal plating layer 12 from the one surface 15a of the resin layer 1.

The semiconductor device wiring member according to the fourth embodiment mode thus configured can be manufactured, for example, as follows. Description of pre-treatment and post-treatment including chemical cleaning, aqueous washing and the like carried out in each step of the manufacturing is omitted for convenience's sake.

The steps from laminating of both sides of a metal plate, as a substrate, with a dry film resist for resist masks (FIG. 12A) to peeling-off of the dry film resist on the both sides (FIG. 12I) are substantially the same as the steps for manufacturing the semiconductor device substrate according to the first embodiment mode shown in FIGS. 2A-2I.

Then, on the side where the plating layers corresponding to internal terminals, wiring parts and external terminals are projected on the metal plate, with the surface of the noble metal plating layer 14, which is to become external terminals, being left uncovered, the remaining sites are sealed with a resin as shown in FIG. 12J. FIG. 12J shows the state of resin-sealing in a case where there is used a metal plate configured so that, on the surface of the Ni plating constituting the metal plating layer 12, the second metal plating layer 13 is not provided but the noble metal plating layer 14 as the second noble metal plating layer is provided. In a case where there is used a metal plate configured so that the second metal plating layer 13 is provided on the surface of the Ni plating constituting the metal plating layer 12 and the noble metal plating layer 14 as the second noble metal plating layer is provided on the surface of the second metal plating layer 13, when resin-sealing is made, the noble metal plating layer 14 projects from the resin surface as shown in FIG. 12J'. In the following explanations, for convenience's sake, the metal plate provided with the noble metal plating layer 14 as the second noble metal plating layer without being provided with the second metal plating layer 13 is to be used. If the metal plate provided with the noble metal plating layer 14 as the second noble metal plating layer without being provided with the second metal plating layer 13 is used, owing to unevenness of the height of the terminals caused by plating in a terminal pattern, the resin may flow into the external terminal surface. In this situation, the external terminal surface should be uncovered by polishing the surface of the sealing resin.

Then, etching is applied to the metal plate of the semiconductor device substrate, to remove the metal plate by dissolution or the like. As a result, the surfaces of the internal terminals, the wiring parts and the external terminals are uncovered at the same level as the resin surface as shown in FIG. 12K Thereby, the semiconductor device wiring member of the present embodiment mode is completed.

Manufacturing of a semiconductor device that uses the semiconductor device wiring member according to the fourth embodiment mode thus manufactured is conducted as follows. FIGS. 13A-13F are explanatory diagrams that show one example of manufacturing procedure for a resin-sealed type semiconductor device using the semiconductor device wiring member according to the fourth embodiment mode manufactured via the manufacturing procedure shown in FIGS. 12A-12K.

FIG. 13A shows a semiconductor device substrate configured so that, on the surface of the Ni plating constituting the metal plating layer 12, the second metal plating layer 13 is not provided but the noble metal plating layer 14 as the second noble metal plating layer is provided and predetermined sites are resin-sealed, and so that the metal plate is removed by dissolution. In a case where there is used a semiconductor device substrate configured so that the second metal plating layer 13 is provided on the surface of the Ni plating constituting the metal plating layer 12 and the noble metal plating layer 14 as the second noble metal plating layer is provided on the surface of the second metal plating layer 13 and predetermined sites are resin-sealed, and so that the metal plate is removed by dissolution, the noble metal plating layer 14 projects from the resin surface as shown in FIG. 13A'. In the following explanations, for convenience's sake, there is to be used the semiconductor device substrate configured so that the noble metal plating layer 14 as the second noble metal plating layer is provided but the second metal plating layer 13 is not provided and predetermined sites are resin-sealed and so that the metal plate is removed by dissolution.

First, a semiconductor element is mounted on the internal-terminal surface side of the semiconductor device wiring member shown in FIG. 13A, and electrodes of the semiconductor element are connected with the internal terminals, which are uncovered at the same level as the resin surface. In this situation, according to the flip chip method, the electrodes of the semiconductor element and the internal terminals are connected as shown in FIG. 13B. According to the wire method, the electrodes of the semiconductor element and the internal terminals are connected via wires, as shown in FIG. 13C. In the semiconductor device wiring member of the fourth embodiment, since the surfaces of the internal terminals as uncovered are at the same level as the resin surface, the semiconductor element can be stably mounted. For convenience's sake, explanation of die bonding for fixing the semiconductor element is omitted here.

Then, as shown in FIG. 13D, the surface on which the semiconductor element is mounted is sealed with a resin. Thereby, the semiconductor device is completed. FIGS. 13A-13D are shown without changing the vertical direction of the semiconductor device substrate.

The semiconductor device as completed is mounted on an external member upon the vertical directions being inverted from the orientation shown in FIG. 13D. In this case, since only the external terminals are left uncovered in reference to the resin, they can be easily connected with connecting terminals provided on the external member. FIG. 13E shows the state at this stage.

Reference Example 1

Next, as a reference example for the semiconductor device substrate and the semiconductor device wiring member of the above embodiment modes, the configuration of a conventional semiconductor device substrate will be explained. FIGS. 14A-14E are explanatory diagrams that show a manufacturing procedure for the conventional semiconductor device substrate according to Reference Example 1. FIGS. 15A-15C are plan views that show the state transition of the semiconductor device substrate in the manufacturing procedure of FIGS. 14A-14E.

Figure 14A:
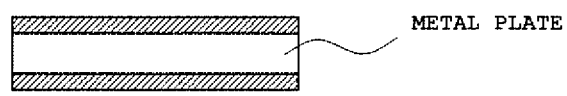
FIGS. 14A-14E are explanatory diagrams that show a manufacturing procedure for a conventional semiconductor device substrate according to Reference Example 1.
Figure 14B:
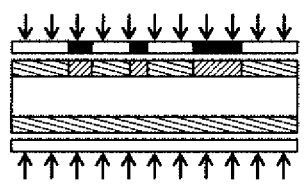
Figure 14C:
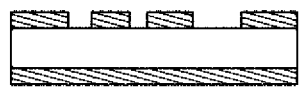
Figure 14D:
Figure 14E:
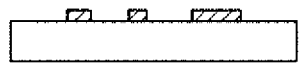
Figure 15A:
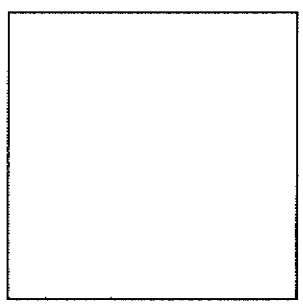
FIGS. 15A-15C are plan views that show the state transition of the semiconductor device substrate in the manufacturing procedure of FIGS. 14A-14E.
Figure 15B:
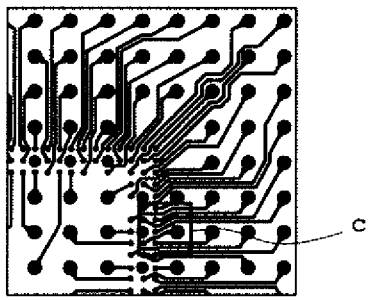
Figure 15C:
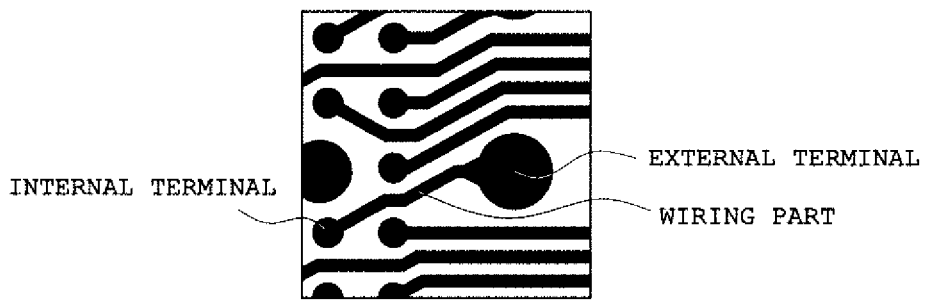

As shown in FIG. 14D, in the semiconductor device substrate of Reference Example 1, the surfaces of the internal terminals, the wiring parts and the external terminals formed on the metal plate are approximately at the same height from the surface of the metal plate.

The semiconductor device substrate of Reference Example 1 thus configured is manufactured, for example, as follows.

As shown in FIGS. 14A-14D, from laminating of both sides of the metal plate, which is to become the semiconductor device substrate, with a dry film resist, formation of pattern-A and full-surface resist masks by exposure and development on the front-surface side and the back-surface side using glass masks, and to plating of the metal plate at sites not covered with the resist mask, the procedure is substantially the same as the manufacturing procedure of the semiconductor device substrate of the first embodiment mode shown in FIGS. 2A-2D.

The semiconductor device substrate of Reference Example 1 is different from the manufacturing method for a semiconductor device substrate of the first embodiment mode in that it is completed by peeling off of the resist mask on both sides at the state shown in FIG. 14D without undergoing the steps shown in FIGS. 2E-2I. Also, the semiconductor device substrate of Reference Example 1 is different from the manufacturing method for a semiconductor device substrate of the second embodiment mode in that it does not undergo the steps shown in FIGS. 6E-6J. Also, the semiconductor device substrate of Reference Example 1 is different from the manufacturing method for a semiconductor device substrate of the third embodiment mode in that it does not undergo the steps shown in FIGS. 12E-12K.

Assembling of a semiconductor device using the semiconductor device substrate of Reference Example 1 manufactured in this way is made as follows. FIGS. 16A-16L are explanatory diagrams that show the manufacturing procedure for a resin-sealed type semiconductor device using the semiconductor device substrate according to Reference Example 1 manufactured via the manufacturing procedure shown in FIGS. 14A-14E.

First, a semiconductor element is mounted on the side of the metal plate where the plating layers that are to become internal terminals, wiring parts and external terminals are projected, and electrodes of the semiconductor element and the internal terminals are connected. In this situation, according to the flip chip method, the electrodes of the semiconductor element and the internal terminals are connected as shown in FIG. 16A. According to the wire method, the electrodes of the semiconductor element and the internal terminals are connected via wires as shown in FIG. 16B. Since the surface on which the semiconductor element is mounted has a variety of height due to uneven thickness formed by the plating process, it is difficult to achieve stable mount. Consequently, an adhesive layer using a film-type or paste-type adhesive material is provided in a gap between the metal plate on which the semiconductor element is mounted and the semiconductor element, to fix the semiconductor element to the metal plate via the adhesive layer so that, when the semiconductor element is mounted, contact of the semiconductor element with a part of the internal terminals should not tilt the semiconductor element.

Then, as shown in FIG. 16C, the surface on which the semiconductor element is mounted is sealed with a resin.

Then, etching is applied to the metal plate of the semiconductor device substrate, to remove the metal plate by dissolution. As a result, on the back surface side of the semiconductor device, the surfaces of the internal terminals, the wiring parts and the external terminals are uncovered at the same level as the resin surface. FIG. 16C shows the state at this stage.

Then, as shown in FIG. 16E, the back surface side of the semiconductor device is covered with a resin, which is processed to have openings to uncover a part of the surface of the external terminals, to form an external insulating layer. Thereby, the semiconductor device is completed.

The external insulating layer is formed in the following manner.

For example, as shown in FIG. 16G, a liquid solder resist for a resist mask is applied to the side where the surfaces of the internal terminals, the wiring parts, and the external terminals are uncovered at the same level as the resin surface shown in FIG. 16F, and pre-curing (preliminary curing) is carried out by heating at a temperature slightly lower than the glass transition point (FIG. 16H).

Then, as shown in FIG. 16I, the pre-cured solder resist is exposed and developed using a glass mask carrying a pattern for forming openings at sites that are to be external terminals. Thereby, as shown in FIG. 16J, a resist mask carrying the pattern for forming the openings at the sites that are to be external terminals is formed. After that, the resist mask undergoes post-curing by further heating, to obtain a final strength (FIG. 16K).

As a result, the semiconductor device shown in FIG. 16L is completed.

The semiconductor device as completed is mounted on an external member. In this case, the external terminals are uncovered as set back from the opening surface of the resist mask. Therefore, solder balls are laid in the openings, thereby electrically connecting with the terminals of the external member. FIG. 16L shows the state at this stage.

Comparison Between Semiconductor Devices of First Embodiment Mode and Reference Example 1

As described above, in the semiconductor device substrate of Reference Example 1, since the plating layers constituting the external terminals, the internal terminals, and the wiring parts are formed to have substantially the same thickness, in the subsequent manufacturing process for a semiconductor device, it is necessary to form an insulating layer for burying the plating layers and to process the insulator layer to form openings therein for connection with the external terminals; an increased number of steps in the assembly of the semiconductor device results in delay in production and deteriorates the productivity.

In contrast, according to the semiconductor device substrate of the first embodiment mode, since a level difference is provided between the external terminals and the internal terminals or the wiring parts, in the subsequent manufacturing procedure for a semiconductor device, it is possible to seal only the internal terminals and the wiring parts with a resin or the like, and to leave only the external terminals uncovered. Therefore, unlike the semiconductor device substrate of Comparative Example 1, processing a connection surface for an external member to form openings therein is dispensable in the manufacturing procedure for a semiconductor device, and thus productivity is improved with a decreased number of processes.

Further, in the semiconductor device substrate of Reference Example 1, since the plurality of internal terminals are formed of plating layers varying in height having a level difference of several micrometers (for example, 5 to 8 μm)

at the top surface, when a semiconductor element is mounted and electrically connected with the internal terminal parts, the semiconductor element may be mounted on a tilt or cause a conduction failure in the electrical connection.

In contrast, according to the semiconductor device substrate of the first embodiment mode, since, in the subsequent manufacturing procedure for a semiconductor device, a uniform height is achieved over an internal terminal surface for mounting a semiconductor element thereon and internal terminal parts to be electrically connected with the semiconductor element, the reliability regarding electrical connection between the semiconductor element and the internal terminal portions is improved.

Comparison Between Semiconductor Devices of Second Embodiment Mode and Reference Example 1

According to the semiconductor device substrate of the second embodiment mode, since a level difference is provided between the external terminals and the internal terminals or the wiring parts and only the internal terminals and the wiring parts are sealed with a resin while only the external terminals are left uncovered, unlike the semiconductor device substrate of Reference Example 1, processing a connection surface for an external member to form openings therein is dispensable in the manufacturing procedure for a semiconductor device, and thus productivity is improved with a decreased number of processes in manufacturing a semiconductor device.

Further, according to the semiconductor device substrate of the second embodiment mode, similar to the semiconductor device substrate of the first embodiment mode, since, in the subsequent manufacturing procedure for a semiconductor device, a uniform height is achieved over an internal terminal surface for mounting a semiconductor element thereon and internal terminal parts to be electrically connected with the semiconductor element, the reliability regarding electrical connection between the semiconductor element and the internal terminal portions is improved.

Comparison Between Semiconductor Devices of Third Embodiment Mode and Reference Example 1

According to the semiconductor device substrate of the third embodiment mode, since a level difference is provided between the external terminals and the internal terminals or the wiring parts and only the internal terminals and the wiring parts are sealed with a permanent resist or the like while only the external terminals are left uncovered, unlike the semiconductor device substrate of Reference Example 1, providing an insulating layer having openings in a connection surface for an external member is dispensable in the manufacturing procedure of a semiconductor device, and thus productivity is improved with a decreased number of processes in manufacturing a semiconductor device. Further, according to the semiconductor device substrate of the third embodiment mode, it can be shipped as a wiring member from which a metal plate has been removed. If so, an etching step for removing the metal plate in manufacturing a semiconductor device is dispensable, and the productivity is further improved.

Further, according to the semiconductor device substrate of the third embodiment mode, similar to the semiconductor device substrate of the first embodiment mode, since, in the subsequent manufacturing procedure for a semiconductor device, a uniform height is achieved over an internal terminal surface for mounting a semiconductor element thereon and internal terminal parts to be electrically connected with the semiconductor element, the reliability regarding electrical connection between the semiconductor element and the internal terminal portions is improved.

Comparison Between Semiconductor Devices of Fourth Embodiment Mode and Reference Example 1

According to the semiconductor device wiring member of the fourth embodiment mode, since a level difference is provided between the external terminals and the internal terminals and the wiring parts and only the internal terminals and the wiring parts are sealed with a resin while only the external terminals are made uncovered at the other surface of the resin layer, unlike the semiconductor device substrate of Reference Example 1, processes of removing the metal plate by etching and of forming openings in a connection surface for an external member are dispensable in the manufacturing procedure for a semiconductor device, and thus productivity is improved with a decreased number of processes in manufacturing a semiconductor device.

Further, according to the semiconductor device wiring member of the fourth embodiment mode, similar to the semiconductor device substrate of the first embodiment mode, since, in the subsequent manufacturing procedure for a semiconductor device, a uniform height is achieved over an internal terminal surface for mounting a semiconductor element thereon and internal terminal parts to be electrically connected with the semiconductor element, the reliability regarding electrical connection between the semiconductor element and the internal terminal portions is improved.

Embodied Example 1

Next, description will be made of an embodied example of the semiconductor device substrate and a manufacturing method therefor corresponding to the first embodiment mode of the present invention.

Although pre-treatment and post-treatment including chemical cleaning, aqueous washing and the like were carried out in each step, they are common treatment and thus description is omitted.

First, a copper material having a thickness of 0.15 mm, which is for the use as a leadframe material also, was prepared as a metal plate.

In the step of forming a resist mask, a dry film resist (AQ-2558: manufactured by Asahi Kasei Corporation) having a thickness of 25 μm was made to laminate both surfaces of the metal plate (see FIG. 2A).

Then, the dry film resist on the front surface side was exposed and developed using a glass mask carrying a pattern A for forming a plating at predetermined sites on the front surface side, to form a resist mask having openings at the sites where the plating is to be formed (see FIG. 2B and FIG. 2C). For the dry film resist on the back surface side, a resist mask covering the entire back surface of the metal plate was formed. The exposure and development was the same as the conventional method; the exposure of the dry film resist into the pattern A was carried out by, upon closely fitting the glass mask for exposure to the dry film resist, irradiating them with ultraviolet rays, and the development was carried out with sodium carbonate.

In the next plating step, after a common pre-treatment for plating, the metal plate free from covering by the resist mask was plated so that Au of 0.003 µm or more, Pd of 0.01 µm or more, and Ni of 6 µm or more were formed in this order as shown in FIG. 2D.

Then, the resist masks on the both surfaces were peeled off, and the same dry film resist was made to laminate the both surfaces (see FIG. 2E). At that time, it was necessary to select the thickness of the resist according to the thickness of the second metal plating layer to be formed. In this embodied example, in order to form the second metal plating layer to have a thickness of 15 to 40 µm, a resist having a thickness of 50 µm was used only for the front surface side, and a resist having a thickness of 25 µm was used for the back surface side.

Then, a resist mask was formed by exposure and development using a glass mask that carried a pattern B for forming a plating that is to be additionally layered on sites that were a part of the previously-formed plating layer and that were to become external terminals (See FIG. 2F and FIG. 2G). In the same manner as in the previous step of forming a resist mask, a resist mask covering the entire surface was formed on the back surface side.

In the next plating step, an Ni plating surface free from covering by the resist mask as formed was plated so that Ni of 40 µm or more, Pd of 0.01 µm or more, Au of 0.003 µm or more were formed in this order (see FIG. 2H), and then the resist masks on the both surfaces were removed, to fabricate a semiconductor device substrate (see FIG. 2I).

On the side where the plating layers corresponding to internal terminals, wiring parts and external terminals were projected on the metal plate of the completed semiconductor device substrate, with the surface of the noble metal plating layer 14, which was to become the external terminals, being left uncovered, the remaining sites were sealed with a resin (see FIG. 4B). Then, the metal plate (copper material) was removed by etching (see FIG. 4C), a semiconductor element was mounted on the side that had once adjoined the metal plate, to establish electrical conduction with the internal terminals with the resin-fixed plating layer being used as a wiring (see FIG. 4D), and the semiconductor-element-mount portion was resin-sealed. Thereby obtained was a semiconductor device in which the surface of the external terminals was free from covering by the surface of the resin (see FIG. 4F).

Embodied Example 2

Next, description will be made of an embodied example of the semiconductor device substrate and a manufacturing method therefor corresponding to the second embodiment mode of the present invention.

Although pre-treatment and post-treatment including chemical cleaning, aqueous washing and the like were carried out in each step, they are common treatment and thus description is omitted.

In substantially the same manner as in Embodied Example 1, the steps from preparation of a metal plate, laminating with a dry film resist (FIG. 6A), to peeling off of the resist mask on both sides (FIG. 6I) were carried out.

Then, on the side where the plating layers corresponding to internal terminals, wiring parts and external terminals were projected on the metal plate, with the surface of the noble metal plating layer, which was to become the external terminals, being left uncovered, the remaining sites were sealed with a resin (see FIG. 6J), In this way, a semiconductor device substrate was fabricated.

The metal plate (copper material) of the semiconductor device substrate as completed was removed by etching (see FIG. 7B), a semiconductor element was mounted on the side that had once adjoined the metal plate, to establish electrical conduction with the internal terminals with the resin-fixed plating layer being used as a wiring (see FIG. 7C), and the semiconductor-element-mount portion was resin-sealed. Thereby obtained was a semiconductor device in which the surface of the external terminals was free from covering by the surface of the resin (see FIG. 7E).

Embodied Example 3

Next, description will be made of an embodied example of the semiconductor device substrate and a manufacturing method therefor corresponding to the third embodiment mode of the present invention.

Although pre-treatment and post-treatment including chemical cleaning, aqueous washing and the like were carried out in each step, they are common treatment and thus description is omitted.

In substantially the same manner as in Embodied Example 1, the steps from preparation of a metal plate, laminating with a dry film resist (FIG. 9A) to plating with Au, Pd and Ni (FIG. 9D) in this order were carried out.

Then, the resist masks on the both surfaces were peeled off, and a film-type permanent resist (KI-1000T4F: manufactured by Hitachi Kasei Co., Ltd.) was made to laminate the front surface side on which the plating layers had been formed), whereas the previously-used dry film resist was made to laminate the back surface side (see FIG. 9E). At that time, it was necessary to select the thickness of the permanent resist according to the thickness of the second metal plating layer to be formed. In this embodied example, in order to form the second metal plating layer to have a thickness of 15 to 40 µm, a permanent resist having a thickness of 50 µm was used, and a resist having a thickness of 25 µm was used for the back surface side.

Then, a resist mask was formed by exposure and development using a glass mask that carried a pattern B for forming a plating that is to be additionally layered on sites that were a part of the previously-formed plating layer and that were to become external terminals (See FIG. 9F and FIG. 9G). In the same manner as in the previous step of forming a resist mask, a resist mask covering the entire surface was formed on the back surface side.

In the next plating step, two substrates having two kinds of plating were made: a substrate plated with, on an Ni plating surface free from covering by the resist mask as formed, Pd of 0.01 µm or more and Au of 0.003 µm or more in this order, and a substrate plated with, on an Ni plating surface free from covering by the resist mask as formed, Ni of 15 µm or more, Pd of 0.01 µm or more, and Au of 0.003 µm or more (see FIG. 9H, 9I). Then, the resist mask on the back surface of each substrate was removed, to fabricate two kinds of semiconductor device substrate (see FIG. 9J).

Figure 10G:
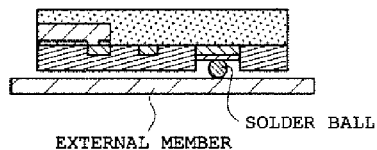

The metal plate (copper material) of each completed semiconductor device substrate was removed by etching (see FIG. 10B), a semiconductor element was mounted on the side that had once adjoined the metal plate, to establish electrical conduction with the internal terminals with the resin-fixed plating layer being used as a wiring (see FIG. 10C), and the semiconductor-element-mount portion was resin-sealed. Thereby obtained were two kinds of semiconductor devices: one in a position where the surface of the external terminals was substantially at the same level as the surface of the permanent resist (see FIG. 10E), the other in a position where the surface of the external terminals was withdrawn from the surface of the permanent resist (as shown in FIG. 10G, the position that allows electrical connection with connecting terminals of an external member by laying solder balls in the openings).

Embodied Example 4

Next, description will be made of an embodied example of the semiconductor device wiring member and a manufacturing method therefor corresponding to the fourth embodiment mode of the present invention.

Although pre-treatment and post-treatment including chemical cleaning, aqueous washing and the like were carried out in each step, they are common treatment and thus description is omitted.

In substantially the same manner as in Embodied Example 1, the steps from preparation of a metal plate, laminating with a dry film resist (FIG. 12A), to peeling off of the resist mask on both sides (FIG. 12I) were carried out.

Then, on the side where the plating layers corresponding to internal terminals, wiring parts and external terminals were projected on the metal plate, with the surface of the noble metal plating layer, which was to become the external terminals, being left uncovered, the remaining sites were sealed with a resin (see FIG. 12J).

Then, the metal plate (copper material) was removed by etching. Thereby a semiconductor device wiring member was fabricated (see FIG. 12K).

A semiconductor element was mounted on the side that had once adjoined the metal plate, to establish electrical conduction with the internal terminals with the resin-fixed plating layer of the completed semiconductor device wiring member being used as a wiring (see FIG. 13C), and the semiconductor-element-mount portion was resin-sealed. Thereby obtained was a semiconductor device in which the surface of the external terminals was free from covering by the surface of the resin (see FIG. 13E).

Fifth Embodiment Mode

A method according to this embodiment mode for manufacturing a semiconductor device includes preparing a semiconductor device substrate configured so that, on a metal plate formed is a plating layer that is to become internal terminals, on which formed is a plating layer having a same shape but made of different metal, on a part of which further formed is a plating layer, and on which formed is a plating layer having a same shape that is to become external terminals, wherein a height of the metal plating layer that is to become the external terminals is larger than a height of other plating layers.

Then, using this semiconductor device substrate, on the side where the plating layers corresponding to the internal terminals, wiring parts and the external terminals are projected on the metal plate of the semiconductor device substrate, with a surface of the external terminals being left uncovered, the remaining sites are sealed with a resin.

Then, the metal plate of the semiconductor device substrate is removed, thereby obtained is a wiring member in which the surface of the plating layers is uncovered at the same level as the resin surface on the side that formerly adjoined the metal plate.

Then, a semiconductor element is mounted on the plating-layer side which has emerged as a result of removal of the metal plate, and electrodes of the semiconductor element are connected with the internal terminals of the plating layers uncovered at the same level as the resin surface.

Then, the side of the surface on which the semiconductor element is mounted is sealed with a resin.

Through these processes, the semiconductor element can be mounted on the unevenness-free surface in conformance with the surface of the metal plate. Further, since the external connection part has already been made uncovered, the conventional machining step for uncovering the external connection part can be omitted.

Embodied Example 5

Figure 17A:
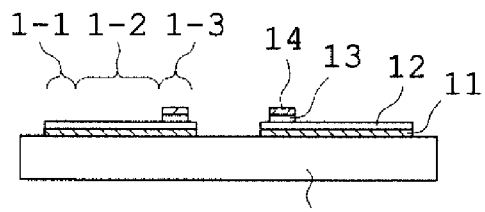
FIGS. 17A-17D are diagrams that show a manufacturing procedure according to one embodied example of the present invention for a semiconductor device.
Figure 17A:
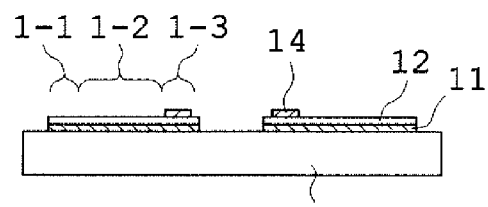
Figure 17B:
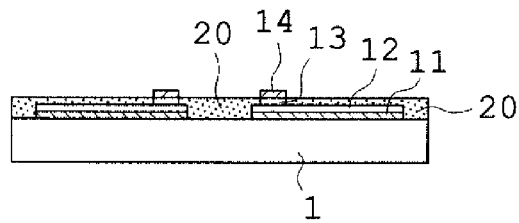
Figure 17B:
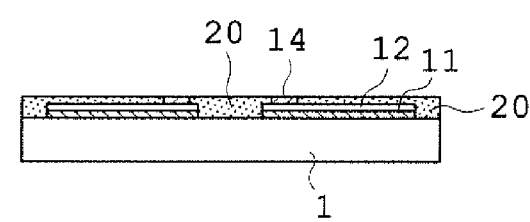
Figure 17C:
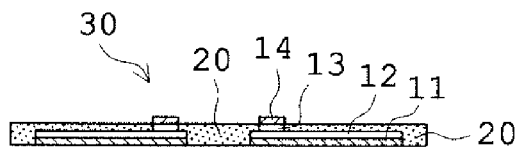
Figure 17D:
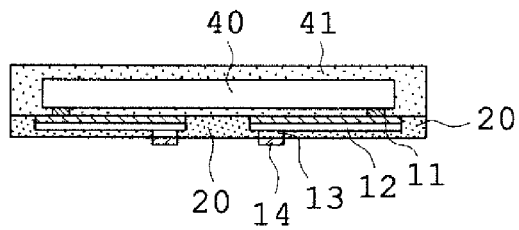

FIGS. 17A-17D are diagrams that show a manufacturing procedure according to an embodied example corresponding to the fifth embodiment mode of the present invention for a semiconductor device; FIG. 17A and FIG. 17A' are explanatory diagrams that respectively show configurations of semiconductor device substrates to be used for the manufacturing according to the embodied example for a semiconductor device, FIG. 17B and FIG. 17B' are explanatory diagrams that respectively show states in which the semiconductor device substrates shown in FIGS. 17A and 17A' are resin-sealed with surfaces of external terminal parts being left uncovered, FIG. 17C is an explanatory diagram that shows a state in which the semiconductor device substrate shown in FIG. 17B is cleared of a metal substrate, to turn into a wiring member, and FIG. 17D is an explanatory diagram that shows a state in which a semiconductor element is mounted on a plating-layer side, which is to become internal terminals, of the wiring member shown in FIG. 17C, electrodes of the semiconductor element and the internal terminal part of the wiring member are connected together, and in which the semiconductor-element-mount side is resin-sealed.

As shown in FIG. 17A, a semiconductor device substrate to be prepared for use in manufacturing a semiconductor device according to this embodiment mode is configured so that: a first noble metal plating layer 11, which is to become internal terminals, is formed at predetermined sites on a metal plate 1; a metal plating layer 12 is formed on the first noble metal plating layer 11 as having a same shape as the first noble metal plating layer 11; a second metal plating layer 13 is formed on a part of the metal plating layer 12; a second noble metal plating layer 14, which is to become external terminals, is formed on the second metal plating layer 13 as having a same shape as the second metal plating layer 13. A height of a surface of the second noble metal plating layer 14, which is to become external terminals, from a surface of the metal plate 1 is larger than a height of other plating layers from the surface of the metal plate 1.

The metal plate 1 is configured of, for example, a copper plate.

The first noble metal plating layer 11 is configured of, for example, an Au plating layer 11a and a Pd plating layer 11b formed in order from the metal-plate-1 side.

The metal plating layer 12 and the second metal plating layer 13 are configured of, for example, Ni plating layers.

The second noble metal plating layer 14 is configured of, for example, a Pd plating layer 14a and an Au plating layer 14b formed in order from the metal-plate-1 side.

A semiconductor device substrate having the height of the surface of the second noble metal plating layer 14 (i.e. the surface of the Au plating layer 14b) from the surface of the metal plate 1 about 40 µm and the height of the surface of the metal plating layer 12 from the surface of the metal plate 1 about 6 µm was used in manufacturing a semiconductor device according to this embodiment mode.

As a modified example of this embodied example, as shown in FIG. 17A', a semiconductor device substrate in which the second noble metal plating layer 14, which is to become external terminals, is formed on a part of the metal plating layer 12 while the second metal plating layer 13 is not formed on the metal plating layer 12 may be used for manufacturing a semiconductor device.

In manufacturing a semiconductor device according to this embodied example, first, upon use of the semiconductor device substrate shown in FIG. 17A, on the side where the plating layers corresponding to an internal terminal portion 1-1, a wiring portion 1-2 and external terminal portion are projected on the metal plate of the semiconductor device substrate, with the surface of the noble metal plating layer 14, which is to become external terminals, being left uncovered, the remaining sites are sealed with a resin 20 as shown in FIG. 17B. FIG. 17B' shows a state where, on the side where the plating layers corresponding to the internal terminal portion 1-1, the wiring portion 1-2 and the external terminal portion are projected on the metal plate of the semiconductor device substrate, with the surface of the noble metal plating layer 14, which is to become external terminals, being left uncovered, the remaining sites are sealed with a resin 20 in the case where the semiconductor device substrate shown in FIG. 17A', as a modified example, is used. If the semiconductor device substrate shown in FIG. 17A' is used, owing to unevenness of the height of the terminals caused by plating in a terminal pattern, the resin may flow into the external terminal surface. In this situation, the external terminal surface should be uncovered by polishing the surface of the sealing resin. For convenience's sake, in the following explanation, the semiconductor device substrate shown in FIG. 17B is to be used.

Then, etching is applied to the metal plate 1 of the semiconductor device substrate, to remove the metal plate 1 by dissolution or the like. As a result, a wiring member 30 configured to have surfaces of the internal terminal portion 1-1, the wiring portion 1-2 and the external terminal portion 1-3 uncovered at the same level as the resin surface on the side formerly adjoined the metal plate 1. FIG. 17C shows the state at this stage.

Then, the wiring member 30 is turned upside down, and, as shown in FIG. 17D, a semiconductor element 40 is mounted on the internal terminal surface side, which has emerged by removal of the metal plate 1, and electrodes of the semiconductor element 40 are connected with the internal terminals, which are uncovered at the same level as the surface of the resin 20. In this situation, according to the flip chip method, the electrodes of the semiconductor element 40 and the internal terminals are connected. According to the wire method, the electrodes of the semiconductor element 40 and the internal terminals are connected via wires. In the wiring member 30, since the surfaces of the internal terminals have got uncovered at the same level as the surface of the resin 20, the semiconductor element 40 can be stably mounted without tilt. For convenience's sake, explanation of die bonding for fixing the semiconductor element is omitted here.

Then, the surface on which the semiconductor element 40 is mounted is sealed with a resin 41. Thereby, the semiconductor device is completed. In the case where a plurality of semiconductor devices are sealed in bulk, individual semiconductor devices are obtained by cutting.

At this stage, since the external connection terminals are already formed on the back surface side of the semiconductor device to be free from covering by the resin 20, the conventional machining step for uncovering the external connection part is not necessary.

The semiconductor device substrate used in the method according to the present invention for manufacturing a semiconductor device can be manufactured via the method described in Example 1.

Sixth Embodiment Mode

A method according to this embodiment mode for manufacturing a semiconductor device includes: a step of fabricating or preparing a semiconductor device wiring member acquired by removal of a metal frame from a semiconductor device substrate and having plating layers fixed by a permanent resist layer, the semiconductor device substrate being configured so that the permanent resist layer having a predetermined thickness thicker than the plating layers formed on the metal plate is formed, and so that, in the permanent resist layer, formed on the metal plate is a plating layer that is to become internal terminals, on which further formed is a metal plating layer as having a same shape, on a part of which further formed is a plating layer that is to become external terminals, or on a part of which further formed is a metal plating layer, on which formed is the plating layer that is to become external terminals; a step of mounting a semiconductor element on a side formerly adjoined the metal plate, of the wiring member; a step of connecting electrodes of the semiconductor element as mounted with internal terminals of the wiring member; and a step of resin-sealing the semiconductor-element mount side.

Through these processes, the semiconductor element can be mounted on the unevenness-free surface of the wiring member in conformance with the surface of the metal plate. Further, the wiring member is configured so that the surface of the external terminals has already been made uncovered at the openings in the permanent resist, the conventional machining processes for forming the resin layer and uncovering the external connection part can be omitted.

Embodied Example 6

Figure 18:
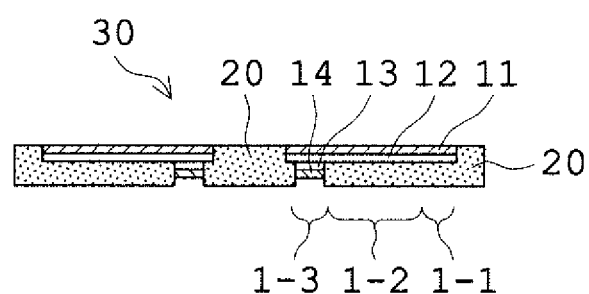
FIG. 18 is a cross-sectional view of a wiring member used in a manufacturing method according to another embodied example of the present invention for a semiconductor device.
Figure 19:
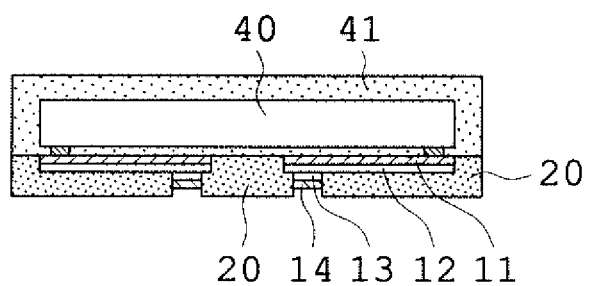
FIG. 19 is an explanatory diagram that shows a state in which a semiconductor element is mounted on a plating-layer side, which is to become internal terminals, of the wiring member shown in FIG. 18, electrodes of the semiconductor element and the internal terminal part of the wiring member are connected together, and in which the semiconductor-element-mount side is resin-sealed.

FIG. 18 is a cross-sectional view of a wiring member used in a manufacturing method according to an embodied example corresponding to the sixth embodiment mode of the present invention for a semiconductor device. FIG. 19 is an explanatory diagram that shows a state in which a semiconductor element is mounted on a plating-layer side, which is to become internal terminals, of the wiring member shown in FIG. 18, electrodes of the semiconductor element and the internal terminal part of the wiring member are connected together, and in which the semiconductor-element-mount side is resin-sealed. FIGS. 20A-20F are explanatory diagrams that show one example of procedure of a manufacturing method for the wiring member used in the manufacturing method according to the embodied example of FIG. 18 for a semiconductor device.

As shown in FIG. 18, in the wiring member 30 prepared to be used for manufacturing of a semiconductor device according to this embodied example, there are formed a first noble metal plating layer 11, which is to become internal terminals, a metal plating layer 12 having a same shape as the first noble metal plating layer 11, a second metal plating layer 13, which is partial in reference to the metal plating layer 12, and a second noble metal plating layer 14, which is to become external terminals, having a same shape as the second metal plating layer 13.

In order from the top of FIG. 18, the first noble metal plating layer 11 is configured of an Au plating layer and a Pd plating layer, the metal plating layer 12 is configured of a Ni plating layer, the second metal plating layer 13 also is configured of a Ni plating layer, the second noble metal plating layer 14 is configured of a Pd plating layer and an Au plating layer; the Au plating layers are uncovered on both of the front and back sides of the wiring member. In FIG. 18, the reference numeral 1-1 denotes an internal terminal portion, the reference numeral 1-2 denotes a wiring portion, and the reference 1-3 denotes an external terminal portion, and the reference numeral 16 denotes, semiconductor element 40 is mounted on the permanent resist.

Next, as shown in FIG. 19, the semiconductor element 40 is mounted on the side of the plating layer 11 (first noble metal plating layer), which is to become the internal terminals, and electrodes of the semiconductor element 40 are connected with the internal terminals, which are uncovered at the same level as the surface of the permanent resist 16. According to the flip chip method, the electrodes of the semiconductor element 40 and the internal terminals are connected. According to the wire method, the electrodes of the semiconductor element 40 and the internal terminals are connected via wires. Since the faces of the internal terminals, which have got uncovered in the wiring member 30, are at the same level as permanent resist 16, the semiconductor element 40 can be stably mounted without tilt. For convenience's sake, explanation of die bonding for fixing the semiconductor element 40 is omitted here.

Then, the surface on which the semiconductor element 40 is mounted is sealed with a resin 41. Thereby, the semiconductor device is completed. In the case where a plurality of semiconductor devices are sealed in bulk, individual semiconductor devices are obtained by cutting.

At this stage, since the external connection terminals are already formed on the back surface side of the semiconductor device to be free from covering by the permanent resist 16 at the openings, machining steps for covering with a resin and uncovering the external connection portion, which were necessary in the conventional method for manufacturing a semiconductor device, are dispensable.

The wiring member 30 used in the method of the present invention for manufacturing a semiconductor device can be manufactured, for example, as follows (see FIGS. 20A-20F).

First, a copper material having a thickness, for example, of 0.15 mm, which is for the use as a leadframe material also, is prepared as a metal plate.

Then, a dry film resist having a thickness, for example, of 25 µm is made to laminate both surfaces of the metal plate 1, and the dry film resist 9 on the front surface side is exposed and developed using a glass mask carrying a pattern A for forming a plating at predetermined sites on the front surface side, to form a resist mask having openings at the sites where the plating is to be formed. For the dry film resist 9 on the back surface side, a resist mask covering the entire back surface of the metal plate 1 is formed. The exposure and development is the same as the conventional method.

Figure 20A:
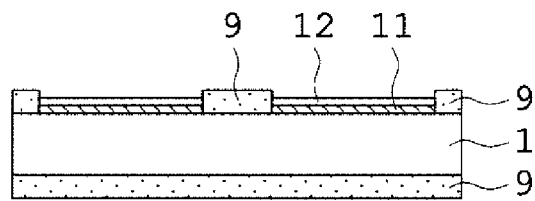
FIGS. 20A-20F are explanatory diagrams that shows one example of procedure of a manufacturing method for the wiring member used in the manufacturing method according to the embodied example of FIG. 18 for a semiconductor device.
Figure 20B:
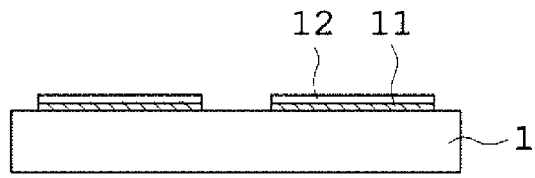
Figure 20C:
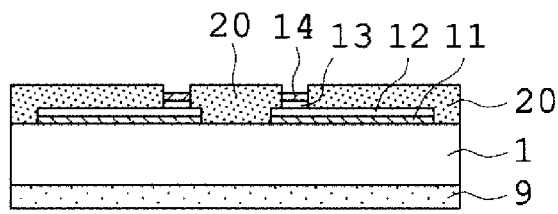
Figure 20D:
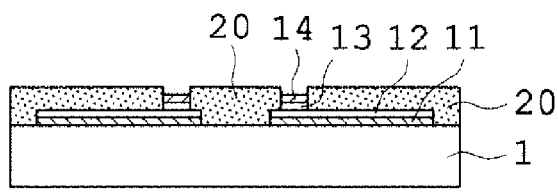

In the next plating step, after general pre-treatment for plating, the metal plate 1 free from covering by the resist mask is plated so that, as the first noble metal plating layer, Au of 0.003 µm or more and Pd of 0.01 µm or more, and, as the metal plating layer, Ni of 6 µm or more are formed in this order (see FIG. 20A).

Then, the resist masks on the both sides are peeled off (see FIG. 20B), and a permanent resist 20 is made to laminate the front surface side whereas the same dry film resist 9 as mentioned above is made to laminate the back surfaced above. At this time, it is necessary to select the thickness of the permanent resist 16 according to the thickness of the second metal plating layer to be formed. In order to form the second metal plating layer to have a thickness of 15 to 35 µm, a permanent resist 16 with a thickness of 40 µm is used only for the front surface side, and the resist 9 with a thickness of 25 µm is used on the back surface side.

Then, a resist mask is formed by exposure and development using a glass mask having a pattern B for forming a plating that is to be additionally layered on sites that are a part of the previously-formed plating layer and that are to become external terminals. On the back surface side, a resist mask which covers the entire surface is formed similarly to the previous time.

Figure 20E:
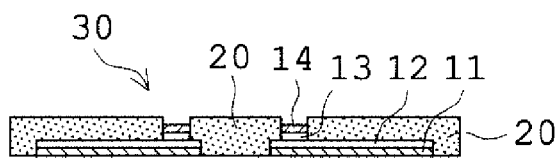

Then, after the surface of the Ni plating as the metal plating layer free from covering by the resist layer is sequentially plated with Ni of 30 µm or more as the second metal plating layer, and Pd of 0.01 µm or more and Au of 0.003 µm or more as the second noble metal plating layer (see FIG. 20C), the resist mask on the back surface is removed while the permanent resist 16 is left (see FIG. 20D), and then removal of the metal plate makes a wiring member 30 (see FIG. 20E).

The second metal plating may be omitted so that the surface of the Ni plating as the metal plating layer is plated with, as the second noble metal plating layer, Pd of 0.01 µm or more and Au of 0.003 µm or more.

Figure 20F:
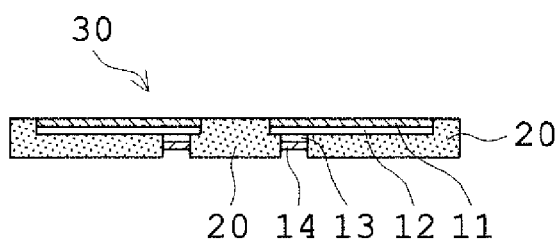

Then, in order to mount a semiconductor element on the removed-metal-plate-1-side surface, the wiring member 30 is turned upside down (see FIG. 20F).

Reference Example 2

Next, the conventional method for manufacturing a semiconductor device will be described as Reference Example 2.

In contrast to the semiconductor device substrate used in the present invention, a conventional semiconductor device substrate has a plating layer that is to become external terminals formed on a metal plate, a plating layer overlaid thereon as having the same shape, and a plating layer that is to become internal terminals formed on the upper side. These plating layers are formed to have substantially the same height as a plurality of pieces of plating layers in accordance with a number of electrodes of a semiconductor element to be mounted.

The semiconductor element is mounted on the internal terminals of this semiconductor device substrate, and the electrodes of the semiconductor element and the internal terminals are connected together.

However, when a plurality of pieces having a height of 30 µm, 40 µm or so in terms of plating thickness are to be formed by plating, a height difference of about 5 to 8 µm is generated as a variation during plating production. Therefore, in the conventional semiconductor device substrate, there is a variation in height from the metal plate to the upper surface of the internal terminals.

Therefore, when the semiconductor element is mounted, the semiconductor element may be tilted or a conduction failure may occur in the connection between the electrodes of the semiconductor element and the internal terminals.

After mounting the semiconductor element, the side on which the semiconductor element is mounted is sealed with resin, and only the metal plate of the semiconductor device substrate is removed.

The removal of the metal plate makes a surface having adjoined the metal plate, of the plating layer that is to become the external terminals, emerge on the back surface side of the resin.

Then, in order to use a part of the emerging external terminal surface as an external terminal portion to be connected with the outside, the entire back surface side of the resin is covered with a resin, and then the covering resin is processed to open a part of it so that only the external terminal portion is free from covering, thereby the semiconductor device is completed. In a type in which a large number of semiconductor devices are sealed in bulk, individual semiconductor devices are obtained by cutting.

Although the embodiment modes and embodied examples of the semiconductor device substrate, the semiconductor device wiring member and the manufacturing method therefor, and the method for manufacturing a semiconductor device using the semiconductor device substrate according to the present invention have been described above, the semiconductor device substrate and the semiconductor device wiring member are not limited to the configurations of the above-described embodiment modes and embodied examples.

For example, in the semiconductor device substrate of the first to third embodiment modes and the semiconductor device wiring member of the fourth embodiment mode, used for the first noble metal plating layer are Au and Pd, used for the metal plating layer is Ni, used for the second metal plating layer is Ni, and used for the second noble metal plating layer are Pd and Au. However, the combination of the plating used for forming the first noble metal plating layer, the metal plating layer (or the metal plating layer and the second metal plating layer), and the second noble metal plating layer is not limited thereto. As modified examples, the semiconductor device substrate and the semiconductor device wiring member according to the present invention may be configured by combining the first noble metal plating layer, the metal plating layer (or the metal plating layer and the second metal plating layer) and the second noble metal plating layer formed by plating as shown in the following Table 1. In Table 1, plating is shown as being applied in order from the top of the column in each modified example.

[Table 1]
Combination of Plating Constituting Semiconductor Device Substrate or Semiconductor Device Wiring Member

|  | Modified Example | | | | | | | | |
| --- | --- | --- | --- | --- | --- | --- | --- | --- | --- |
|  | 1 | 2 | 3 | 4 | 5 | 6 | 7 | 8 | 9 |
| 1st Noble Metal Plating | Au | Ag | Au Pd | Au | Ag | Au Pd | Ag Pd | Pd | Pd |
| Metal Plating Layer (or Metal Plating Layer & 2nd Metal Plating Layer | Ni | Ni | Ni | Ni | Ni | Ni | Ni | Ni | Ni |
| 2nd Noble Metal Plating Layer | Au | Au | Au | Pd Au | Pd Au | Pd Au | Au | Au | Pd Au |

INDUSTRIAL APPLICABILITY

A semiconductor device substrate, a semiconductor device wiring member and a method for manufacturing them, and a method for manufacturing a semiconductor device using the semiconductor device substrate are useful in the fields where assembling a surface-mount type, resin-sealed semiconductor device is required.

DESCRIPTION OF THE REFERENCE SYMBOLS 1 metal plate
1-1 internal terminal portion
1-2 wiring portion
1-3 external terminal portion
9 resist
11 plating layer to become internal terminals (first noble metal plating layer)
11a Au plating layer (first noble metal plating layer)
11b Pd plating layer (first noble metal plating layer)
12 Ni plating layer (metal plating layer)
13 Ni plating layer (second metal plating layer)
14 plating layer to become external terminal (second noble metal plating layer)
14a Pd plating layer (second noble metal plating layer)
14b Au plating layer (second noble metal plating layer)
15 resin layer
15a one surface
15b other surface
16 permanent resist
20 resin
30 wiring member
40 semiconductor element
41 resin

The invention claimed is:

1. A semiconductor device substrate comprising:
a metal plate;
a first noble metal plating layer formed at predetermined sites defined by predetermined boundaries on a surface of the metal plate, the first noble metal plating layer to become internal terminals;
a metal plating layer formed on the first noble metal plating layer so as to have a shape defined by plating boundaries coinciding with the predetermined boundaries of the first noble metal plating layer defining the predetermined sites; and
a second noble metal plating layer formed on a part of the metal plating layer within an area defined by the plating boundaries of the metal plating layer, the second noble metal plating layer to become external terminals,
wherein the first noble metal plating layer is configured of an Ag plating layer or a lamination of an Ag plating layer and a Pd plating layer arranged in this order against the metal plate so that an Ag surface of the first noble metal plating layer is in contact with a surface of the metal plate,
wherein the metal plating layer is configured of an Ni plating layer,
wherein the second noble metal plating layer is configured of an Au plating layer or a lamination of a Pd plating layer and an Au plating layer arranged in this order so that a top surface of the second noble metal plating layer is an Au surface, the top surface being a surface of the second noble metal plating layer located farthest from the metal plate, and
wherein a height of the top surface of the second noble metal plating layer is larger than a height of a surface of any other plating layer from the surface of the metal plate.

2. The semiconductor device substrate according to claim 1, further comprising a resin layer encapsulating the surface of the metal plate and the metal plating layer while leaving the top surface of the second noble metal plating layer uncovered.

3. The semiconductor device substrate according to claim 1,
further comprising a permanent resist encapsulating the surface of the metal plate and the metal plating layer while leaving the top surface of the second noble metal plating layer uncovered.

4. The semiconductor device substrate according to claim 3,
wherein the permanent resist is formed as a permanent resist layer with a predetermined thickness allowing an upper surface thereof to be positioned at a level higher than the top surface of the second noble metal plating layer.

5. A method of manufacturing a semiconductor device using the semiconductor device substrate according to claim 4, the method comprising:
fabricating a wiring member in which the first noble metal plating layer, the metal plating layer, and the second noble metal plating layer are fixed by the permanent resist layer by removing the metal plate from the semiconductor device substrate such that only the upper surface of the second noble metal plating layer is left uncovered at openings in an upper surface of the permanent resist layer, wherein a bottom surface of the first noble metal plating layer and a lower surface of the permanent resist layer are uncovered at a same level as each other, the bottom surface of the first noble metal plating layer being an Ag surface; and
mounting a semiconductor element on a side of the wiring member from which the metal plate has been removed.

6. A method of manufacturing a semiconductor device using the semiconductor device substrate according to claim 4, the method comprising:
preparing a wiring member in which the first noble metal plating layer, the metal plating layer, and the second noble metal plating layer are fixed by the permanent resist layer by removing the metal plate from the semiconductor device substrate such that the first noble metal plating layer is formed in a predetermined pattern in the permanent resist layer on a side of the first noble metal plating layer closest to the metal plate, and in which only the top surface of the second noble metal plating layer is left uncovered at openings in an upper surface of the permanent resist layer, wherein a bottom surface of the first noble metal plating layer and a lower surface of the permanent resist layer are uncovered at a same level as each other, the bottom surface of the first noble metal plating layer being an Ag surface;
mounting a semiconductor element on a side of the wiring member from which the metal plate has been removed to establish conduction at portions of the first noble metal plating layer left uncovered on the wiring member with electrodes of the semiconductor element; and
resin-sealing a semiconductor-element mount side.

7. The method according to claim 6,
wherein the permanent resist layer is formed on the metal plate to be thicker than a total thickness from the bottom surface of the first noble metal plating layer to the top surface of the second noble metal plating layer.

8. The semiconductor device substrate according to claim 1,
further comprising a second metal plating layer formed between the metal plating layer and the second noble metal plating layer so as to have a shape defined by plating boundaries coinciding with boundaries of the second noble metal plating layer,
wherein the second metal plating layer is configured of a Ni plating layer.

9. A method of manufacturing a semiconductor device using the semiconductor device substrate according to claim 1, the method comprising:
forming a resin layer encapsulating the surface of the metal plate and the metal plating layer while leaving the top surface of the second noble metal plating layer of the semiconductor device substrate uncovered;
fabricating a wiring member in which the first noble metal plating layer, the metal plating layer, and the second noble metal plating layer are held by the resin layer by removing the metal plate after formation of the resin layer, wherein a bottom surface of the first noble metal plating layer and a lower surface of the resin layer are uncovered at a same level as each other, the bottom surface of the first noble metal plating layer being an Ag surface; and
mounting a semiconductor element on the wiring member.

10. A method of manufacturing a semiconductor device using the semiconductor device substrate according to claim 1, the method comprising:
forming a resin layer encapsulating the surface of the metal plate and the metal plating layer while leaving the top surface of the second noble metal plating layer of the semiconductor device substrate uncovered;
fabricating a wiring member in which the first noble metal plating layer, the metal plating layer, and the second noble metal plating layer are held by the resin layer by removing the metal plate after formation of the resin layer, wherein a bottom surface of the first noble metal plating layer and a lower surface of the resin layer are uncovered at a same level as each other, the bottom surface of the first noble metal plating layer being an Ag surface; and
mounting a semiconductor element on the bottom surface of the first noble metal plating layer of the wiring member at a side from which the metal plate has been removed.

11. A method of manufacturing a semiconductor device using the semiconductor device substrate according to claim 1, the method comprising:
forming a resin layer encapsulating the surface of the metal plate and the metal plating layer while leaving the top surface of the second noble metal plating layer uncovered;
fabricating a wiring member in which the first noble metal plating layer, the metal plating layer, and the second noble metal plating layer are held by the resin layer by removing the metal plate after formation of the resin layer, wherein a bottom surface of the first noble metal plating layer and a lower surface of the resin layer are uncovered at a same level as each other, the bottom surface of the first noble metal plating layer being an Ag surface;
mounting a semiconductor element on the bottom surface of the first noble metal plating layer of the wiring member at a side from which the metal plate has been removed to establish conduction between electrodes of the semiconductor element and the internal terminals; and
resin-sealing a portion of the wiring member on which the semiconductor element is mounted.

12. A semiconductor device wiring member comprising:
a first noble metal plating layer formed at predetermined sites defined by predetermined boundaries on a reference plane, the first noble metal plating layer to become internal terminals;
a metal plating layer formed on the first noble metal plating layer so as to have a shape defined by plating boundaries coinciding with the predetermined boundaries of the first noble metal plating layer defining the predetermined sites;
a second noble metal plating layer formed on a part of the metal plating layer within an area defined by the plating boundaries of the metal plating layer, the second noble metal plating layer to become external terminals; and
a resin layer having an upper surface and a lower surface lying on the reference plane,
wherein the first noble metal plating layer is configured of an Ag plating layer or a lamination of an Ag plating layer and a Pd plating layer arranged in this order from the reference plane so that a bottom surface is an Ag surface of the first noble metal plating layer lying on the reference plane,
wherein the metal plating layer is configured of an Ni plating layer,
wherein the second noble metal plating layer is configured of an Au plating layer or a lamination of a Pd plating layer and an Au plating layer arranged in this order so that a top surface of the second noble metal plating layer is an Au surface, the top surface being a surface of the second noble metal plating layer located farthest from the metal plating layer,
wherein a height of the top surface of the second noble plating layer from the reference plane is larger than a height of a top surface of any other plating layer from the reference plane,
wherein the bottom surface of the first noble metal plating layer is uncovered at a same level as the lower surface of the resin layer, and
wherein the top surface of the second noble metal plating layer is free from covering by the upper surface of the resin layer.

13. The semiconductor device wiring member according to claim 12,
further comprising a second metal plating layer formed between the metal plating layer and the second noble metal plating layer so as to have a shape defined by plating boundaries coinciding with boundaries of the second noble metal plating layer,
wherein the second metal plating layer is configured of a Ni plating layer.

14. A method of manufacturing a semiconductor device substrate, the method comprising:
forming on a surface of a metal plate a resist mask having pattern-A openings;
forming in the pattern-A openings a first noble metal plating layer having boundaries conforming to the pattern-A openings, the first noble metal plating layer being configured of an Ag plating layer or lamination of an Ag plating layer and a Pd plating layer arranged in this order so that a bottom surface of the first noble metal plating layer is in contact with the surface of the metal plate, the bottom surface of the first noble metal plating layer being an Ag surface;
forming on the first noble metal plating layer a metal plating layer having boundaries coinciding with the boundaries of the first noble metal plating layer conforming to the pattern-A openings, the metal plating layer being configured of a Ni plating layer;
peeling off the resist mask;
after peeling off of the resist mask, forming a second resist mask having pattern-B openings leaving a part of the metal plating layer uncovered; and
forming in the pattern-B openings a second noble metal plating layer, the second noble metal plating layer being configured of an Au plating layer or lamination of a Pd plating layer and an Au plating layer arranged in this order, or a second metal plating layer and the second noble metal plating layer, the second metal plating layer being configured of an Ni plating layer, wherein a top surface of the second noble metal plating layer is an Au surface, and boundaries of the second noble metal plating layer and the second metal plating layer are within an area defined by the boundaries of the first noble metal plating layer and the metal plating layer conforming to the pattern-B openings.

15. The method according to claim 14,
further comprising peeling off the second resist mask after formation of the second noble metal plating layer or the second metal plating layer and the second noble metal plating layer in the pattern-B openings.

16. The method according to claim 14, further comprising:
peeling off the second resist mask after formation of the second noble metal plating layer or the second metal plating layer and the second noble metal plating layer in the pattern-B openings; and
after peeling off of the second resist mask, forming a resin layer encapsulating the surface of the metal plate and the metal plating layer while leaving a top surface of the second noble metal plating layer uncovered.

17. The method according to claim 14,
wherein the second resist mask is made of a permanent resist.

18. The method according to claim 14,
wherein the top surface of the second noble metal plating layer is positioned at a level below an upper surface of the second resist mask.

19. A method of manufacturing a semiconductor device wiring member using the method according to claim 14, the method comprising:
peeling off the second resist mask after formation of the second noble metal plating layer or the second metal plating layer and the second noble metal plating layer in the pattern-B openings;
after peeling off of the second resist mask, forming a resin layer encapsulating the surface of the metal plate and the metal plating layer while leaving the top surface of the second noble metal plating layer uncovered; and
removing the metal plate after formation of the resin layer so that the bottom surface of the first noble metal plating layer and a lower surface of the resin layer are uncovered at a same level as each other.

* * * * *